United States Patent
Aziz et al.

(10) Patent No.: US 7,795,806 B2
(45) Date of Patent: Sep. 14, 2010

(54) REDUCED REFLECTANCE DISPLAY DEVICES CONTAINING A THIN-LAYER METAL-ORGANIC MIXED LAYER (MOML)

(75) Inventors: Hany Aziz, Oakville (CA); Zoran D. Popovic, Mississauga (CA); Nemanja Stefanovic, Toronto (CA); Jennifer A. Coggan, Cambridge (CA)

(73) Assignee: LG Display Co., Ltd., Seoul (KR)

( * ) Notice: Subject to any disclaimer, the term of this patent is extended or adjusted under 35 U.S.C. 154(b) by 435 days.

(21) Appl. No.: 11/133,752

(22) Filed: May 20, 2005

(65) Prior Publication Data
US 2006/0261727 A1 Nov. 23, 2006

(51) Int. Cl.
*H01L 51/54* (2006.01)
*H05B 33/14* (2006.01)

(52) U.S. Cl. ..................... 313/506; 313/504
(58) Field of Classification Search ............... 313/504, 313/506
See application file for complete search history.

(56) References Cited

U.S. PATENT DOCUMENTS

| | | |
|---|---|---|
| 2,823,905 A | 2/1958 | Brown |
| 3,172,862 A | 3/1965 | Gurnee et al. |
| 3,598,644 A | 8/1971 | Goffe et al. |
| 4,084,966 A | 4/1978 | Haas et al. |
| 4,287,449 A | 9/1981 | Takeda et al. |
| 4,356,429 A | 10/1982 | Tang |
| 4,539,507 A | 9/1985 | VanSlyke et al. |
| 4,652,794 A | 3/1987 | Waite et al. |
| 4,665,115 A | 5/1987 | Lundberg et al. |
| 4,720,432 A | 1/1988 | VanSlyke et al. |
| 4,769,292 A | 9/1988 | Tang et al. |
| 4,885,211 A | 12/1989 | Tang et al. |
| 5,049,780 A | 9/1991 | Dobrowolski et al. |
| 5,059,861 A | 10/1991 | Littman et al. |
| 5,141,671 A | 8/1992 | Bryan et al. |

(Continued)

FOREIGN PATENT DOCUMENTS

EP   0 831 676   3/1998

(Continued)

OTHER PUBLICATIONS

Welying Gao; Controlled p doping of the hole-transport molecular material N,N'=diphenyl-N,N'-bis(1-naphthyl)-1,1'-biphenyl-4,4'-diamine with Terafluorotetracyanoquinodimethane, Journal of Applied Physics, vol. 94, No. 1 (Jul. 1, 2003), pp. 359-366.

(Continued)

*Primary Examiner*—Nimeshkumar D Patel
*Assistant Examiner*—Anthony T Perry
(74) *Attorney, Agent, or Firm*—McKenna Long & Aldridge LLP (57) ABSTRACT

A display device comprising a thin metal-organic mixed layer (MOML) comprising a metal (containing material) and an organic material, and having a thickness of less than 175 nm. A thin metal-organic mixed layer may be of a single or multi-layer configuration. The percent reflectance of a device may be controlled by varying the thickness of the MOML(s) and the metal component and concentration thereof in the MOML(s).

25 Claims, 5 Drawing Sheets

U.S. PATENT DOCUMENTS

| | | |
|---|---|---|
| 5,150,006 A | 9/1992 | Van Slyke et al. |
| 5,151,629 A | 9/1992 | VanSlyke |
| 5,227,252 A | 7/1993 | Murayama et al. |
| 5,247,190 A | 9/1993 | Friend et al. |
| 5,276,381 A | 1/1994 | Wakimoto et al. |
| 5,409,783 A | 4/1995 | Tang et al. |
| 5,429,884 A | 7/1995 | Namiki et al. |
| 5,457,565 A | 10/1995 | Namiki et al. |
| 5,516,577 A | 5/1996 | Matsuura et al. |
| 5,593,788 A | 1/1997 | Shi et al. |
| 5,601,903 A | 2/1997 | Fujii et al. |
| 5,608,287 A | 3/1997 | Hung et al. |
| 5,703,436 A | 12/1997 | Forrest et al. |
| 5,707,745 A | 1/1998 | Forrest et al. |
| 5,719,467 A | 2/1998 | Antoniadis et al. |
| 5,728,801 A | 3/1998 | Wu et al. |
| 5,739,635 A | 4/1998 | Wakimoto |
| 5,776,622 A | 7/1998 | Hung et al. |
| 5,837,391 A | 11/1998 | Utsugi |
| 5,846,666 A | 12/1998 | Hu et al. |
| 5,853,905 A | 12/1998 | So et al. |
| 5,925,472 A | 7/1999 | Hu et al. |
| 5,925,980 A | 7/1999 | So et al. |
| 5,935,720 A | 8/1999 | Chen et al. |
| 5,935,721 A | 8/1999 | Shi et al. |
| 5,942,340 A | 8/1999 | Hu et al. |
| 5,952,115 A | 9/1999 | Hu et al. |
| 5,955,836 A | 9/1999 | Boerner et al. |
| 5,972,247 A | 10/1999 | Shi et al. |
| 6,013,384 A | 1/2000 | Kido et al. |
| 6,023,073 A | 2/2000 | Strite |
| 6,028,327 A | 2/2000 | Mizoguchi et al. |
| 6,057,048 A | 5/2000 | Hu et al. |
| 6,105,202 A | 8/2000 | Grasso et al. |
| 6,107,734 A | 8/2000 | Tanaka et al. |
| 6,130,001 A | 10/2000 | Shi et al. |
| 6,225,467 B1 | 5/2001 | Esteghamatian et al. |
| 6,229,012 B1 | 5/2001 | Hu et al. |
| 6,274,980 B1 | 8/2001 | Burrows et al. |
| 6,303,250 B1 | 10/2001 | Watanabe et al. |
| 6,392,250 B1 | 5/2002 | Aziz et al. |
| 6,392,339 B1 | 5/2002 | Aziz et al. |
| 6,423,429 B2 | 7/2002 | Kido et al. |
| 6,437,123 B1 | 8/2002 | Bock et al. |
| 6,465,115 B2 | 10/2002 | Shi et al. |
| 6,479,172 B2 | 11/2002 | Hu et al. |
| 6,562,485 B2 | 5/2003 | Hu et al. |
| 6,565,996 B2 | 5/2003 | Hatwar et al. |
| 6,614,175 B2 | 9/2003 | Aziz et al. |
| 6,717,358 B1 | 4/2004 | Liao et al. |
| 6,734,625 B2 | 5/2004 | Vong et al. |
| 6,737,177 B2 | 5/2004 | Aziz et al. |
| 6,740,429 B2 | 5/2004 | Aziz et al. |
| 6,750,609 B2 | 6/2004 | Aziz et al. |
| 6,753,098 B2 | 6/2004 | Aziz et al. |
| 6,759,146 B2 | 7/2004 | Aziz et al. |
| 6,765,348 B2 | 7/2004 | Aziz et al. |
| 6,773,830 B2 | 8/2004 | Aziz et al. |
| 6,821,643 B1 | 11/2004 | Hu et al. |
| 6,841,932 B2 | 1/2005 | Aziz et al. |
| 7,083,490 B2 | 8/2006 | Mueller et al. |
| 7,211,948 B2 | 5/2007 | Liao et al. |
| 7,288,887 B2 | 10/2007 | Aziz et al. |
| 7,291,404 B2 | 11/2007 | Aziz et al. |
| 7,351,999 B2 | 4/2008 | Li |
| 2002/0037398 A1 | 3/2002 | Tofuku et al. |
| 2002/0121860 A1 | 9/2002 | Seo et al. |
| 2002/0135296 A1 | 9/2002 | Aziz et al. |
| 2002/0145380 A1 | 10/2002 | Aziz et al. |
| 2002/0180349 A1 | 12/2002 | Aziz et al. |
| 2003/0071565 A1 | 4/2003 | Hatwar et al. |
| 2003/0116772 A1 | 6/2003 | Yamazaki et al. |
| 2003/0134146 A1 | 7/2003 | Aziz et al. |
| 2003/0189401 A1 | 10/2003 | Kido et al. |
| 2003/0230974 A1 | 12/2003 | Chang et al. |
| 2003/0234609 A1* | 12/2003 | Aziz et al. .................. 313/504 |
| 2004/0004433 A1 | 1/2004 | Lamansky et al. |
| 2004/0009418 A1 | 1/2004 | Main et al. |
| 2004/0018383 A1 | 1/2004 | Aziz et al. |
| 2004/0027059 A1 | 2/2004 | Tsutsui |
| 2004/0209184 A1 | 10/2004 | Hatakeyama et al. |
| 2004/0227460 A1 | 11/2004 | Liao et al. |
| 2004/0262615 A1 | 12/2004 | Cok |
| 2005/0064235 A1 | 3/2005 | Liao et al. |
| 2005/0100760 A1 | 5/2005 | Yokoyama |
| 2005/0112400 A1 | 5/2005 | Seo et al. |
| 2005/0140275 A1 | 6/2005 | Park |
| 2005/0175857 A1 | 8/2005 | Coggan et al. |
| 2006/0105202 A1 | 5/2006 | Kitamura |
| 2006/0139516 A1 | 6/2006 | Park |
| 2006/0139893 A1 | 6/2006 | Yoshimura et al. |
| 2006/0194076 A1 | 8/2006 | Nariyuki |
| 2006/0251919 A1 | 11/2006 | Aziz et al. |
| 2006/0251920 A1 | 11/2006 | Aziz et al. |
| 2006/0261727 A1 | 11/2006 | Aziz et al. |
| 2006/0261731 A1 | 11/2006 | Aziz et al. |
| 2006/0263593 A1 | 11/2006 | Aziz et al. |
| 2006/0263628 A1 | 11/2006 | Aziz et al. |
| 2006/0263629 A1 | 11/2006 | Aziz et al. |
| 2006/0265278 A1 | 11/2006 | DiMeo |

FOREIGN PATENT DOCUMENTS

| | | |
|---|---|---|
| EP | 0 977 287 A2 | 2/2000 |
| EP | 0 977 288 A2 | 2/2000 |
| EP | 1 009 044 A2 | 6/2000 |
| EP | 1 010 359 | 6/2000 |
| EP | 1 017 118 | 7/2000 |
| EP | 1 029 832 | 8/2000 |
| EP | 1 160 890 A2 | 12/2001 |
| EP | 1 167 488 | 1/2002 |
| EP | 1 311 139 | 5/2003 |
| EP | 1 339 112 | 8/2003 |
| EP | 1 408 563 | 4/2004 |
| EP | 1 624 503 | 2/2006 |
| EP | 1 624 504 | 2/2006 |
| JP | 04-230997 | 8/1992 |
| JP | 06-176870 | 6/1994 |
| JP | 8-222374 | 8/1996 |
| JP | 09-188875 | 7/1997 |
| JP | 10-316904 | 12/1998 |
| JP | 11-312584 | 11/1999 |
| JP | 11-329749 | 11/1999 |
| JP | 2002-055203 | 2/2003 |
| JP | 2003-045676 | 2/2003 |
| JP | 2003-086381 | 3/2003 |
| JP | 2003-151777 | 5/2003 |
| JP | 2004-039617 | 2/2004 |
| JP | 2004-095546 | 3/2004 |
| JP | 2004-139981 | 5/2004 |
| JP | 2004-317897 | 11/2004 |
| JP | 2005-070574 | 3/2005 |
| JP | 2005-072012 | 3/2005 |
| JP | 2006-173550 | 6/2006 |
| JP | 2006-210845 | 8/2006 |
| WO | WO 97/33296 | 9/1997 |
| WO | WO 98/41065 | 9/1998 |
| WO | WO 00/06816 | 2/2000 |
| WO | WO 00/30139 | 5/2000 |
| WO | WO 01/06816 A1 | 1/2001 |
| WO | WO 01/08240 | 2/2001 |
| WO | WO 03/055275 | 7/2003 |
| WO | WO 03/088718 A1 | 10/2003 |
| WO | WO/2004/068911 | 8/2004 |

| | | |
|---|---|---|
| WO | WO 2005/037954 | 4/2005 |
| WO | WO 2006/033472 A1 | 3/2006 |
| WO | WO 2006/038573 | 4/2006 |
| WO | WO 2006/072092 | 7/2006 |
| WO | WO 2006/076092 A1 | 7/2006 |

OTHER PUBLICATIONS

H. Michelle Grandia et al.; Light-Absorption Phenomena in Novel Low-Reflective Cathodes for Organic Light-Emitting Devices Utilizing Metal-Organic Mixtures; Advanced Materials, 2003, 15, No. 23; pp. 2021-2024.

Choong et al.; "Organic Light Emitting Diodes With a Bipolar Transport Layer"; Applied Physics Letters; vol. 75, No. 2, Jul. 12, 1999, pp. 172-174.

Matsumoto, Toshio et al., Multiphoton Emission OLED: Structure and Property, IDW'03; Dec. 2003, pp. 1285-1288.

A. Gyoutoku et al., "An Organic Electroluminescent Dot-Matrix Display Using Carbon Underlayer", Synthetic Metals, vol. 91, pp. 73-75 (1997).

Baldo et al., "Highly efficient phosphorescent emission from organic electroluminescent devices," Letters to Nature, vol. 395, pp. 151-154 (1998).

Bernius et al., "Developmental Progress of Electroluminescent Polymeric Materials and Devices" Proceedings of SPIE Conference on Organic Light Emitting Materials and Devices III, Denver, Colo., vol. 3797, p. 129-137 (Jul. 1999).

Carter et al., "*Polymeric anodes for improved polymer light-emitting diode performance*", Appl. Phys. Lett. 70 (16), pp. 2067-2069 (Apr. 21, 1997).

Chengfeng Qiu et al., Comparative Study of Metal or Oxide Capped Indium-Tin Oxide Anodes for Organic Light-Emitting Diodes, Journal of Applied Physics, vol. 93, No. 6 pp. 3253-3257 (Mar. 15, 2003).

Chengfeng Qiu et al., "Praseodymium Oxide Coated Anode for Organic Light-Emitting Diode", Applied Physics Letters, vol. 80, No. 19, pp. 3485-3487 (May 13, 2002).

Chieh-Wei Chen et al., "Top-Emitting Organic Light-Emitting Devices Using Surface-Modified Ag Anode," Applied Physics Letters, vol. 83, No. 25, pp. 5127-5129 (Dec. 22, 2003).

Hongjin Jiang et al., "Improvement of Organic Light-Emitting Diodes Performance by the Insertion of a $Si_3N_4$ Layer", Thin Solid Films, vol. 363, pp. 25-28 (2000).

I-Min Chan et al., "Enhanced Hole Injections in Organic Light-Emitting Devices by Depositing Nickel Oxide on Indium Tin Oxide Anode," Applied Physics Letters, vol. 81, No. 10, pp. 1899-1901 (Sep. 2, 2002).

Kido et al., "White-Light-Emitting Organic Electroluminescent Device Using Lanthanide Complexes," Jpn. J. Appl. Phys., vol. 35, pp. L394-L396 (1996).

Kim et al., "*Anode material based on Zr-doped ZnO thin films for organic light-emitting diodes*", Appl. Phys. Lett., vol. 83, No. 18, pp. 3809-3811 (Nov. 3, 2003).

Kim et al., "*Molecular organic light-emitting diodes using highly conducting polymers as anodes*", Appl. Phys. Lett., vol. 80 No. 20, pp. 3844-3846 (May 20, 2002).

L.S. Hung et al., "Anode Modification of in Organic Light-Emitting Diodes by Low-Frequency Plasma Polymerization of CHF3", Applied Physics Letters, vol. 78, No. 5, pp. 673-675 (Jan. 29, 2001).

S. A. VanSlyke et al., "Organic Electroluminescent Devices with Improved Stability", Applied Physics Letters, vol. 69, No. 15, pp. 2160-2162 (Oct. 7, 1996).

S. Karg et al., "Increased Brightness and Lifetime of Polymer Light Emitting Diodes with Polyanilne Anodes", Synthetic Metals, vol. 80, pp. 111-117 (1996).

Soo-Jin Chua et al., "Stabilization of Electrode Migration in Polymer Electroluminescent Devices", Applied Physics Letters, vol. 81, No. 6, pp. 1119-1121 (Aug. 5, 2002).

Wenping Hu et al., "Lowering of Operational Voltage of Organic Electroluminescent Devices by Coating Indium Tin Oxide Electrodes with a Thin $CuO_x$ Layer", Applied Physics Letters, vol. 80, No. 15, pp. 2640-2641 (Apr. 15, 2002).

Yulong Shen et al., "Modification of Indium Tin Oxide for Improved Hole Injection in Organic Light Emitting Diodes," Advanced Materials, vol. 13, No. 16 pp. 1234-1238 (Aug. 16, 2001).

Z.B. Deng et al., "Enhanced Brightness and Efficiency in Organic Electroluminescent Devices Using $SiO_2$ Buffer Layers", Applied Physics Letters, vol. 74, No. 15, pp. 2227-2229 (Apr. 12, 1999).

Zugang et al., "*Organic thin film electroluminescent devices with ZnO:Al as the anode*", J. Phys.: Condens. Matter 8, pp. 3221-3228 (1996).

Blochwitz et al., "Non-polymeric OLEDs with a doped amorphous hole transport layer and operating voltages down to 3.2 V to achieve 100 cd/m$^2$", Synth. Metals 2002, vol. 127, pp. 169-173.

Aziz et al., "Reduced reflectance cathode for organic light-emitting devices using metalorganic mixtures", Applied Physics Letters, vol. 83, No. 1, 2003, pp. 186-188.

Day et al., "The use of charge transfer interlayers to control hole injection in molecular organic light emitting diodes", Thin Solid Films, vol. 410, No. 1-2, 2002 pp. 159-166.

Endo et al., "Organic Electroluminescent Devices with a Vacuum-Deposited Lewis-Acid-Doped Hole-Injecting Layer", Japanese Journal of Applied Physics, vol. 41, No. 3B, 2002, pp. L358-L360.

Ha et al., "Improving the efficiency of organic electroluminescent, devices by introducing an electron-accepting and thermally stable polymer", Optical Materials, vol. 21, 2002, pp. 165-168.

Liu et al., "Development of highly stable organic electroluminescent devices with a doped co-host emitter system", Current Applied Physics 5, 2005, pp. 218-221.

* cited by examiner

REDUCED REFLECTANCE DISPLAY DEVICES CONTAINING A THIN-LAYER METAL-ORGANIC MIXED LAYER (MOML)

BACKGROUND

The present disclosure relates, in various exemplary embodiments, to display devices comprising thin (thin-layer) metal-organic mixed layers (MOMLs). The thin metal-organic mixed layers comprise metal particles in an organic matrix material. While the thin metal-organic mixed layers are described with particular reference to organic light emitting devices (OLEDs), it will be appreciated that the thin metal-organic mixed layers are amenable to other similar applications and display devices.

Organic light emitting devices (OLEDs) represent a promising technology for display applications. A typical organic light emitting device includes a first electrode; a luminescent region comprising one or more electroluminescent organic material(s); and a second electrode; wherein one of the first electrode and the second electrode functions as a hole-injecting anode, and the other electrode functions as an electron-injecting cathode; and wherein one of the first electrode and the second electrode is a front electrode, and the other electrode is a back electrode. The front electrode is transparent (or at least partially transparent) while the back electrode is usually highly reflective to light. When a voltage is applied across the first and second electrodes, light is emitted from the luminescent region and through the transparent front electrode. When viewed under high ambient illumination, the reflective back electrode reflects a substantial amount of the ambient illumination to the observer, which results in higher ratios of reflected illumination as compared to the device's own emission resulting in "washout" of the displayed image.

In order to improve the contrast of electroluminescent displays in general, light-reflection-reduction layers as described, for example, in U.S. Pat. No. 4,287,449, or optical interference members as described, for example, in U.S. Pat. No. 5,049,780, have been used to reduce the ambient illumination reflection.

Another problem of known organic light emitting devices originates from the use of metals with low work functions, and hence high reactivity, in the cathodes. Due to their high reactivity, such cathode materials are unstable in ambient conditions and react with atmospheric $O_2$ and water to form non-emissive dark spots. See, for example, Burrows et al., "Reliability and Degradation of Organic Light Emitting Devices," Appl. Phys. Lett. Vol. 65, pp. 2922-2924 (1994). To reduce such ambient effects, organic light emitting devices are typically hermetically sealed, immediately after fabrication, under stringent conditions, such as, for example, less than 10 ppm moisture atmospheres.

Other recent developments in reducing the reflection of ambient light in display devices have been directed to metal-organic mixed layers such as described in, for example, U.S. patent application Ser. No. 10/117,812, which is published as U.S. Patent Publication No. 2002/0180349, now U.S. Pat. No. 6,841,932, and U.S. patent application Ser. No. 10/401,238, which is published as U.S. Patent Publication No. 2003/0234609. Other methods to reduce light reflection are addressed in U.S. Pat. No. 6,750,609. These applications and patents are incorporated herein by reference in their entirety.

Other documents that may be relevant to the present application include the following: U.S. Pat. No. 4,652,794; U.S. Pat. No. 6,023,073; Liang-Sun Hung, et al., "Reduction of Ambient Light Reflection in Organic Light-Emitting Diodes," Advanced Materials Vol. 13, pp. 1787-1790 (2001); Liang-Sun Hung, et al., U.S. patent application Ser. No. 09/577,092 (filed May 24, 2000); EP 1 160 890 A2 (claims priority based on above U.S. patent application Ser. No. 09/577,092; Japanese laid open patent document No. 8-222374 (laid open date 813011996); O. Renault, et al., "A low reflectivity multilayer cathode for organic light-emitting diodes," Thin Solid Films, Vol. 379, pp. 195-198 (2000); WO 01/08240 A1; WO 01/06816 A1; David Johnson, et al., Technical Paper 33.3, "Contrast Enhancement of OLED Displays," http://www.luxell.com/pdfs/OLED tech ppr.pdf, pp. 1-3 (April 2001); Junji Kido, et al., "Bright organic electroluminescent devices having a metal-doped electron-injecting layer," Applied Physics Letters Vol. 73, pp. 2866-2868 (1998); Jae-Gyoung Lee, et al., "Mixing effect of chelate complex and metal in organic light-emitting diodes," Applied Physics-Letters Vol. 72, pp. 1757-1759 (1998); Jingsong Huang, et al., "Low-voltage organic electroluminescent devices using pin structures," Applied Physics Letters Vol. 80, pp. 139-141 (2002); L. S. Hung, et al., "Sputter deposition of cathodes in organic light emitting diodes," Applied Physics Letters, Vol. 86, pp. 4607-4612 (1999); EP 0 977 287 A2; EP 0 977 288 A2; Hany Aziz, et al., "Reduced reflectance cathode for organic light-emitting devices using metal organic mixtures," Applied Physics Letters Vol. 83, pp. 186-188 (2003); and, H. Michelle Grandin, et al., "Light-Absorption Phenomena in Novel Low-Reflectance Cathodes for Organic Light-Emitting Devices Utilizing Metal-Organic Mixtures," Advanced Materials, Vol. 15, NO. 23, 2021-2024 (2003).

The entire disclosures of the foregoing patents, applications, and articles are each incorporated herein by reference in their entirety.

Other documents that may be relevant to the present application were submitted in U.S. patent application Ser. No. 09/800,716 (filed Mar. 8, 2001), now abandoned, such other documents being: U.S. Pat. No. 4,885,211; U.S. Pat. No. 5,247,190; U.S. Pat. No. 4,539,507; U.S. Pat. No. 5,151,629; U.S. Pat. No. 5,150,006; U.S. Pat. No. 5,141,671; U.S. Pat. No. 5,846,666; U.S. Pat. No. 5,516,577; U.S. Pat. No. 6,057,048; U.S. Pat. No. 5,227,252; U.S. Pat. No. 5,276,381; U.S. Pat. No. 5,593,788; U.S. Pat. No. 3,172,862; U.S. Pat. No. 4,356,429; U.S. Pat. No. 5,601,903; U.S. Pat. No. 5,935,720; U.S. Pat. No. 5,728,801; U.S. Pat. No. 5,942,340; U.S. Pat. No. 5,952,115; U.S. Pat. No. 4,720,432; U.S. Pat. No. 4,769,292; U.S. Pat. No. 6,130,001; Bernius, et al., "developmental progress of electroluminescent polymeric materials and devices," SPIE Conference on Organic Light Emitting Materials and Devices III, Denver, Colo., July 1999, SPIE, Vol. 3797, pp. 129-137; Baldo, et al., "highly efficient organic phosphorescent emission from organic electroluminescent devices," Nature Vol. 395, pp. 151-154 (1998); and, Kido, et al., "white light emitting organic electroluminescent device using lanthanide complexes," Jpn. J. Appl. Phys. Vol. 35, pp. L394-L396 (1996).

All of the above patents, applications and articles are incorporated by reference in their entirety.

There is still a need to provide compositions suitable for use in a light-reflection-reduction layer for display devices. Additionally, there is also a need to provide new configurations of light-reflection-reduction layers suitable for use in a display device, that are faster, easier or cheaper to fabricate.

BRIEF DESCRIPTION

In accordance with one aspect of the present disclosure, a display device comprises an anode; a cathode; a luminescent region disposed between said anode and said cathode; and a metal-organic mixed layer (MOML) comprising i) metal containing material, and ii) an organic material, wherein said metal-organic mixed layer has a thickness of from about 5 nm to about 175 nm.

In accordance with another aspect of the present disclosure, a display device comprises a first electrode; a second electrode; a luminescent region disposed between said first and second electrodes; and a light-reflection-reduction region comprising a plurality of metal-organic mixed layers, each metal-organic mixed layer comprising a metal and an organic material, wherein said light-reflection-reduction region has a thickness of from about 10 nm to about 175 nm.

In accordance with another aspect of the present disclosure, a display device comprises a first electrode; a second electrode; a luminescent region disposed between said first and second electrodes; and a light-reflection-reduction region comprising a plurality of metal-organic mixed layers, each metal-organic mixed layer comprising a metal and an organic material, wherein said light-reflection-reduction region has a thickness of from about 10 nm to about 100 nm.

In accordance with another aspect of the present disclosure, a display device comprises a first electrode; a second electrode; a luminescent region disposed between said first and second electrodes; and a light-reflection-reduction region comprising a plurality of metal-organic mixed layers, each metal-organic mixed layer comprising a metal and an organic material, wherein said light-reflection-reduction region has a thickness of from about 30 nm to about 50 nm.

In accordance with still another aspect of the present disclosure, a display device comprises an anode; a cathode; a luminescent region disposed between said anode and said cathode; and a single-layer metal-organic mixed layer (MOML) comprising silver (Ag) and an organic material, wherein said MOML comprises silver (Ag) in an amount of from about 5 to about 30 percent by volume of the MOML, and said MOML has a thickness of one of i) from about 10 nm to about 60 nm, and ii) from about 100 nm to about 160 nm.

In accordance with still another aspect of the present disclosure, a display device comprises an anode; a cathode; a luminescent region disposed between said anode and said cathode; and a single-layer metal-organic mixed layer (MOML) comprising silver (Ag) and an organic material, wherein said MOML comprises silver (Ag) in an amount of from about 22% percent by volume of the MOML, and said MOML has a thickness of about 10 nm to about 60 nm.

In accordance with still another aspect of the present disclosure, a display device comprises an anode; a cathode; a luminescent region disposed between said anode and said cathode; and a single-layer metal-organic mixed layer (MOML) comprising silver (Ag) and an organic material, wherein said MOML comprises silver (Ag) in an amount of from about 15% percent by volume of the MOML, and said MOML has a thickness of about 100 nm to about 160 nm.

These and other non-limiting aspects and/or objects of the development are more particularly disclosed below.

BRIEF DESCRIPTION OF THE DRAWINGS

The following is a brief description of the drawings, which are presented for the purposes of illustrating the exemplary embodiments disclosed herein and not for the purposes of limiting the same.

DETAILED DESCRIPTION

The disclosure relates to display devices comprising a thin metal-organic mixed layer. A thin metal-organic mixed layer exhibits light-reflection-reduction properties and is capable of functioning as a light-reflection-reduction layer. A display device in accordance with the present disclosure generally comprises a first electrode, a second electrode, a luminescent region disposed between the first and second electrode, and a thin metal-organic mixed layer. The thin metal-organic mixed layer comprises a metal material and an organic material and has a total layer thickness of less than 175 nm, and may have, in embodiments, a total layer thickness of from about 5 nm to about 175 nm. The thin metal-organic mixed layer may be located or positioned anywhere in the display device. For example, a thin metal-organic mixed layer may be disposed between the first electrode and the luminescent region; between the second electrode and the luminescent region; as part of the first electrode; as part of the second electrode; as part of the luminescent region; or located outside of one of the first or second electrodes.

A display device may comprise a thin metal-organic mixed layer that comprises either a single metal-organic mixed layer, a plurality of thin metal-organic mixed layers. In a single layer configuration, the thickness of the MOML is generally less than 175 nm. The thickness of a single layer MOML may be in the range of about 10 nm to about 60 nm, or about 100 nm to about 160 nm, depending on the concentration of the metal. In a display device comprising a plurality of thin metal-organic mixed layers, the metal-organic mixed layers may be separated by one or more other layers suitable for a display device. Alternatively, a plurality of metal-organic mixed layers may be considered to form a region or zone wherein the plurality of metal-organic mixed layers are in contact with one another, i.e., in a stacked configuration, or the plurality of metal-organic mixed layers are separated by one or more of the layers. In embodiments wherein the thin metal-organic mixed layer has a multi-layer configuration, the total thickness of the thin MOML is less than 175 nm. In embodiments, a thin MOML comprising a plurality of MOMLs may have a thickness of from about 10 nm to about 175 nm. In embodiments, a thin MOML comprising a plurality of MOMLs may have a thickness of from about 10 nm to about 100 nm. In embodiments, a thin MOML comprising a plurality of MOMLs may have a thickness of from about 30 nm to about 50 nm.

In accordance with still another aspect of the present disclosure, a display device comprises an anode; a cathode; a luminescent region disposed between said anode and said cathode; and a single-layer metal-organic mixed layer (MOML) comprising silver (Ag) and an organic material, wherein said MOML comprises silver (Ag) in an amount of from about 22% percent by volume of the MOML, and said MOML has a thickness of about 10 nm to about 60 nm.

In accordance with still another aspect of the present disclosure, a display device comprises an anode; a cathode; a luminescent region disposed between said anode and said cathode; and a single-layer metal-organic mixed layer (MOML) comprising silver (Ag) and an organic material, wherein said MOML comprises silver (Ag) in an amount of from about 15% percent by volume of the MOML, and said MOML has a thickness of about 100 nm to about 160 nm.

For purposes of the present disclosure, the following definitions are applicable. Generally, unless otherwise indicated, the term "layer" refers to a single coating generally having a composition that differs from the composition of an adjacent layer in terms of at least one of i) the concentration of the components and/or ii) the components that form the respective compositions. For example, adjacent layers will be considered separate if they are formed from compositions having the same components but at different concentrations. Please note that the term "metal-organic mixed layer" as used herein encompasses either a single metal-organic mixed layer or plurality of metal-organic mixed layers defining a particular light-reflection-reduction region or zone. The term "region" refers to a single layer, a plurality of layers such as 2, 3, 4, 5 or more layers, and/or one or more "zones." The term "zone" as used herein, such as, for example, with respect to the charge transport zone (i.e., hole transport zone and electron transport zone), the light-emitting zone, and the light-reflection-reduction zone, refers to a single layer, a plurality of layers, a single functional area, or a plurality of functional areas. "Light emitting region" and "luminescent region" are used interchangeably.

A more complete understanding of the processes and apparatuses disclosed herein can be obtained by reference to the accompanying drawings. These figures are merely schematic representations based on convenience and the ease of demonstrating the present development, and are, therefore, not intended to indicate relative size and dimensions of the display devices or components thereof and/or to define or limit the scope of the exemplary embodiments.

Although specific terms are used in the following description for the sake of clarity, these terms are intended to refer only to the particular structure of the embodiments selected for illustration in the drawings, and are not intended to define or limit the scope of the disclosure. In the drawings and the following description below, it is to be understood that like numeric designations refer to components of like function.

Figures 1, 2:
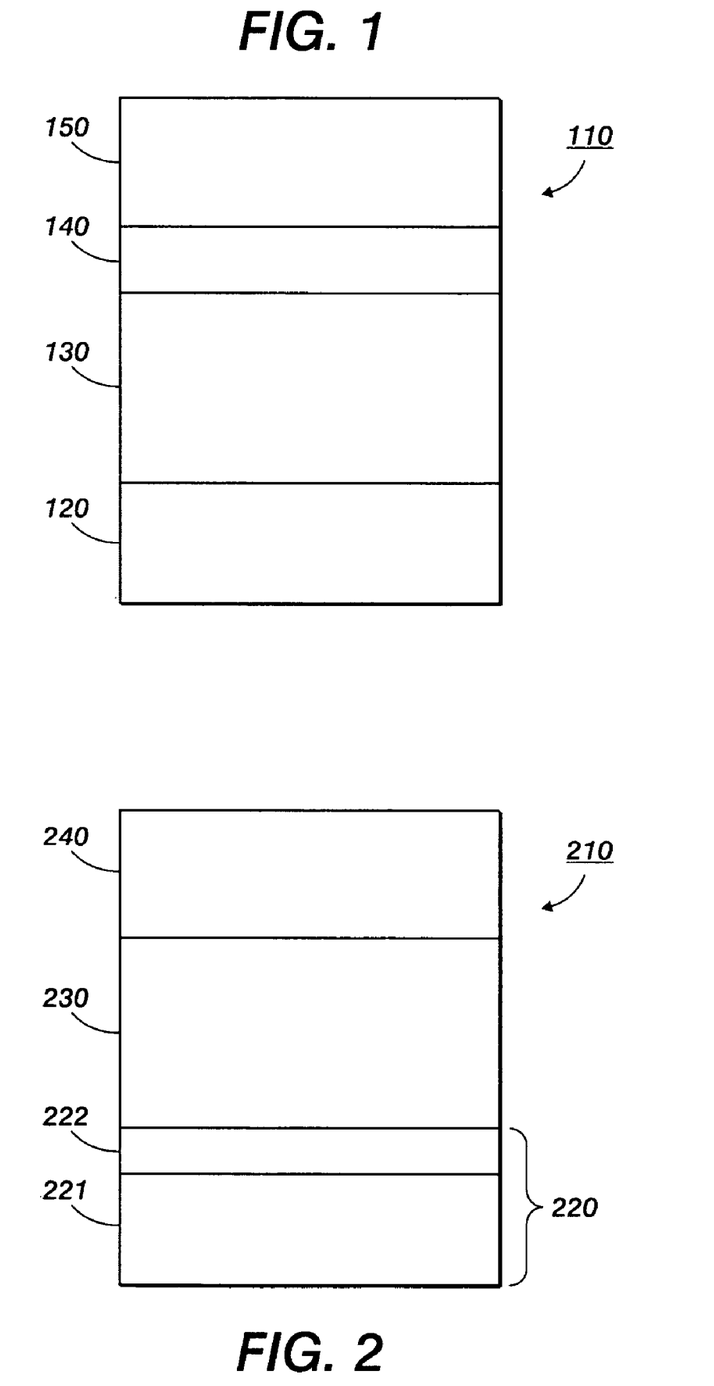
FIG. 1 is a schematic cross-sectional view of a display device comprising thin MOML disposed between a second electrode and a luminescent region.
FIG. 2 is a schematic cross-sectional view of a display device comprising a thin MOML as part of an anode.

FIGS. 1-5 depict several exemplary embodiments of display devices comprising a light-reflection-reduction layer in accordance with the disclosure. With reference to FIG. 1, an organic light emitting device 110 comprises a first electrode 120, a luminescent region 130, a second electrode 150, and a thin metal-organic mixed layer 140 disposed between the second electrode 150 and the luminescent region 130.

With reference to FIG. 2, an organic light emitting device 210 comprises an anode 220, a luminescent region 230, and a cathode 240. Anode 220 comprises a layer 221 comprising an anode material, and a thin MOML 222.

Figure 3:
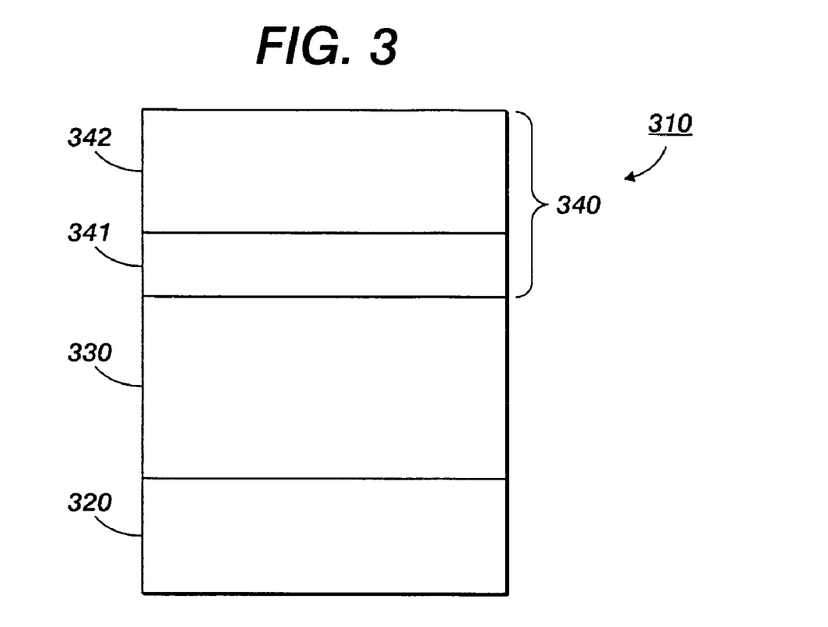
FIG. 3 is a schematic cross-sectional view of a display device comprising a thin MOML as part of a cathode.

With reference to FIG. 3, an organic light emitting device 310 comprises an anode 320, a luminescent region 330, and a cathode 340. The cathode 340 comprises a thin metal-organic mixed layer 341 in accordance with the present disclosure and an additional layer 342. It will be appreciated, that a display device such as the device shown in FIG. 4 may comprise one or more additional layers such as layer 342. An additional layer, such as layer 342, may be, for example, a capping layer or region. In embodiments of a cathode comprising one or more such additional layers, the light-reflection-reduction layer acts as an electron injection contact. The light-reflection-reduction layer is formed to contact the luminescent region 330.

Figure 4:
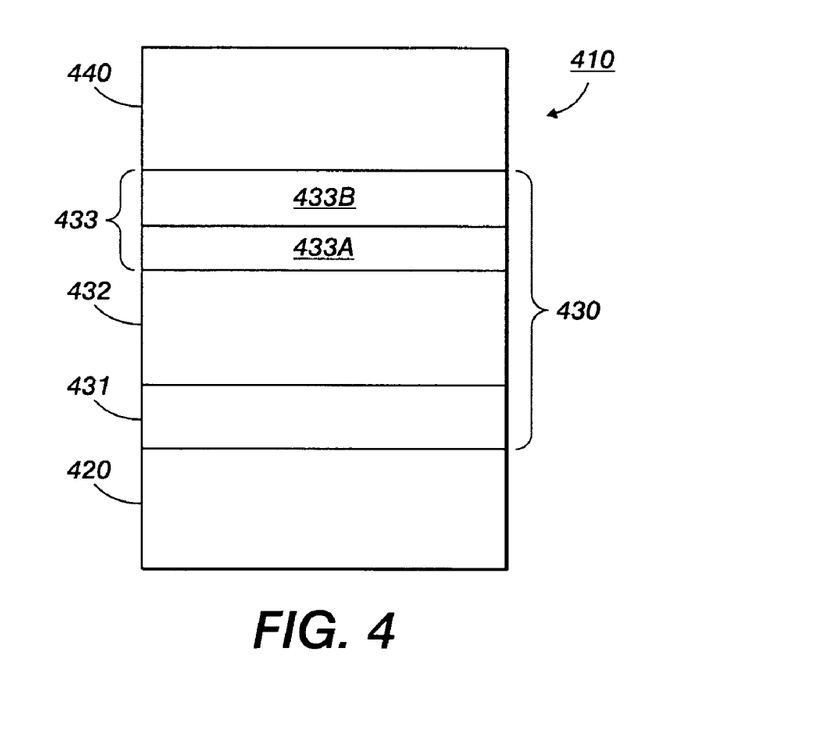
FIG. 4 is a schematic cross-sectional view of a display device comprising a thin MOML as part of a luminescent region.

With reference to FIG. 4, a thin metal-organic mixed layer is depicted as being part of the luminescent region. In FIG. 4, organic light emitting device 410 comprises a first electrode 420, a luminescent region 430, and a second electrode 440. Luminescent region 430 comprises a first charge transport zone 431, a light emitting zone 432, and a second charge transport zone 433. As shown in FIG. 4, second charge transport zone 433 comprises a thin metal-organic mixed layer 433A, and a charge transport layer 433B. The first electrode can be either a cathode or an anode, and the second electrode can be either a cathode or an anode. In addition, the first charge transport zone 431 can be either a hole transport zone (with the second charge transport zone being an electron transport zone) or an electron transport zone (with the second charge transport zone being a hole transport zone).

It will be appreciated that the thin metal-organic mixed layer can be located anywhere inside the luminescent region. For example, a MOML can be located inside (and hence can be viewed as being part of) the electron transport zone or the hole transport zone (where the electron transport zone and the hole transport zone correspond to functional areas of the same layer or to two, three or more layers that comprise the luminescent region). The thin metal-organic mixed layer also can be located in between the electron transport zone and the light emitting zone, or in between the hole transport zone and the light emitting zone.

Figure 5:
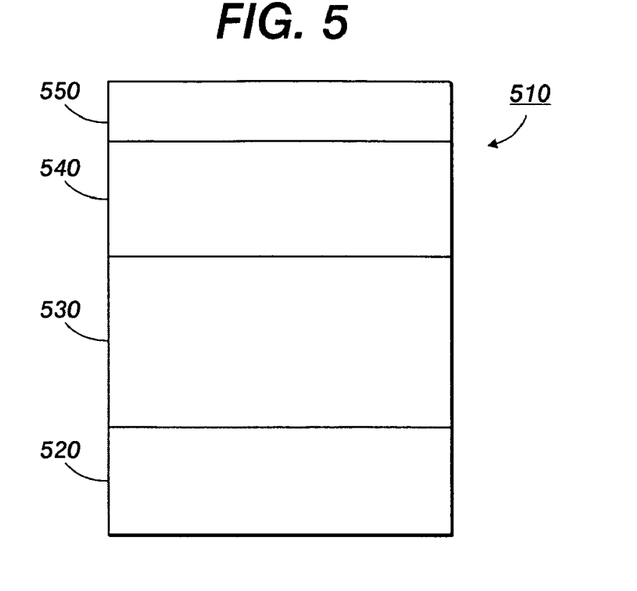
FIG. 5 is a schematic cross-sectional view of a display device comprising a thin MOML outside of the electrodes of the display device.

With reference to FIG. 5, a display device is shown wherein a thin metal-organic mixed layer is located or positioned outside of the electrodes. In FIG. 5, organic light emitting device 510 comprises a first electrode 520, a luminescent region 530, a second electrode 540, and a thin metal-organic mixed layer 550 located outside the second electrode 540. The first electrode may be either the anode or the cathode and the second electrode may be either the cathode or the anode.

Figure 6:
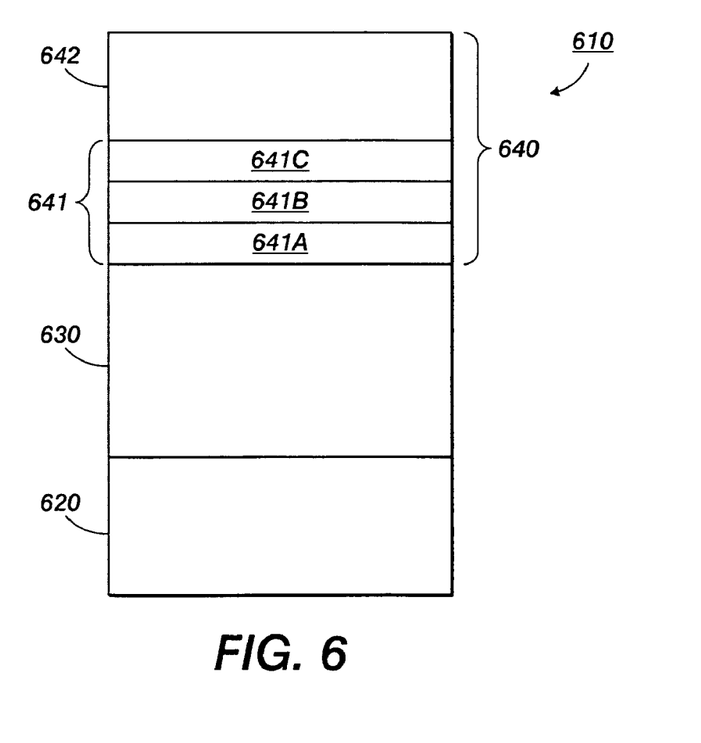
FIG. 6 is a schematic cross-sectional view of a display device comprising a multi-layer thin MOML.

With reference to FIG. 6, a display device comprising a multi-layer thin metal-organic mixed layer is shown. In FIG. 6, organic light emitting device 610 comprises a first electrode 620, a luminescent region 630, and a second electrode 640. The first electrode can be either the cathode or the anode, and the second electrode can be either the cathode or the anode. The second electrode 640 comprises a thin metal-organic mixed layer 641 and an additional layer 642. Thin metal-organic mixed layer region 641 comprises three separate thin metal-organic mixed layers 641A, 641B, and 641C. As used herein, adjacent thin metal-organic mixed layers are considered separate if the compositions of the adjacent layers differ from one another in terms of either the components of the thin metal-organic mixed layer or the concentrations or ratios of the components in the layers. That is, adjacent thin metal-organic mixed layers having the same components, i.e., the same metal material and organic material, will be considered separate layers if the components are present in the respective layers at different concentration levels. For purposes of the disclosure, adjacent thin metal-organic mixed layers having the exact same composition will be considered a single metal-organic mixed layer. While shown as part of a second electrode such as, for example, a cathode, it will be appreciated that a thin MOML comprising a plurality of MOMLs may be part of the first electrode, including, for example an anode, part of the luminescent region, disposed between one of the first and second electrodes and the luminescent region, or be located outside of one of the first or second electrodes.

While not shown in the figures, it will be appreciated that a display device, such as the OLEDs of FIGS. 1-8, may include a substrate adjacent one of the first or second electrodes, i.e., adjacent one of the anode or the cathode. A substantially transparent substrate can comprise various suitable materials including, for example, polymeric components, glass, quartz and the like. Suitable polymeric components include, but are not limited to polyesters such as MYLAR®, polycarbonates, polyacrylates, polymethacrylates, polysulfones, and the like. Other substrate materials can also be selected provided, for example, that the materials can effectively support the other layers, and do not interfere with the device functional performance.

An opaque substrate can comprise various suitable materials including, for example, polymeric components like polyesters such as MYLAR®, polycarbonates, polyacrylates, polymethacrylates, polysulfones, and the like, which contain coloring agents or dyes such as carbon black. The substrate can also be comprised of silicon such as amorphous silicon, polycrystalline silicon, single crystal silicon, and the like. Another class of materials that can be used in the substrate are ceramics such as metallic compounds like metal oxides, metal halides, metal hydroxides, metal sulfides and others.

In embodiments, the substrate may have a thickness ranging for example from about 10 micrometers to about 5,000 micrometers. In other embodiments, the substrate may have a thickness of from about 25 micrometers to about 1,000 micrometers.

A thin metal-organic mixed layer comprises i) a metal containing material, and ii) an organic material, and have a thickness of less than 175 nm. In embodiments, a thin layer metal-organic mixed layer has a thickness of from about 10 nm to about 70 nm. In other embodiments, a thin metal-organic mixed layer has a thickness of from about 30 nm to about 50 nm. In thin MOMLs comprising a plurality of MOMLs, the individual MOMLs may have a thickness, in embodiments, of from about 1 nm to about 95 nm, and in other embodiments from about 1 nm to about 45 nm.

Suitable metals for use in a thin MOML include, for example, metals and metal compounds having light absorbing properties. The metals can be, but are not limited to, for example, Li, Na, K, Rb, Cs, Be, Mg, Ca, Sr, Ba, Sc, Y, La, Ti, Zr, Hf, V, Nb, Ta, Cr, Mo, W, Nm, Tc, Fe, Ru, Os, Co, Rh, Ir, Ni, Pd, Pt, Cu, Ag, Au, Zn, Cd, B, Al, Ga, In, Sn, Pb, Sb, Bi, Se, Te, Ce, Nd, Sm, and Eu. In embodiments, the term "metals" includes Sb, Se, and Te. In further embodiments, a metal alloy can be used to form the MOML. One metal of the metal alloy is considered the metal containing material; the other metal or metals of the metal alloy are considered the additional component or components of the MOML. For instance, a binary metal alloy in combination with the organic material would be considered a Ternary MOML.

The metal compounds for the thin MOML may be a metal halide (e.g., fluoride, chloride, bromide, iodide), metal oxide, metal hydroxide, metal nitride, metal sulfide, metal carbide, and a metal boride). The metal halides can be, but are not limited to, for example, LiF, LiCl, LiBr, LiI, NaF, NaCl, NaBr, NaI, KF, KCl, KBr, KI, RbF, RbCl, CsF, CsCl, $MgF_2$, $CaF_2$, $SrF_2$, $AlF_3$, AgCl, AgF, and $CuCl_2$. The metal oxides can be, but are not limited to, $Li_2O$, $Ca_2O$, $Cs_2O$, $In_2O_3$, $SnO_2$, ZnO, ITO, $Cu_2O$, CuO, $Ag_2O$, NiO, TiO, $Y_2O_3$, $ZrO_2$, $Cr_2O_3$. The metal hydroxide can be, but is not limited to, for example, AgOH. The metal nitride can be, but is not limited to, LaN, YN and GaN. The metal sulfide can be, but is not limited to, ZnS, $Sb_2S_3$, $Sb_2S_5$, and CdS. The metal carbide can be, but is not limited to, $Li_2C$, FeC and NiC. The metal boride can be, but is not limited to, $CaB_6$.

The metal material may also comprise metal nanoparticles as described in U.S. patent application Ser. No. 11/133,753, which is concurrently filed herewith and is incorporated herein by reference.

As described herein, some metal compounds are known to be electrically conductive and light absorbing. Mixtures of organic compounds and these metal compounds therefore in embodiments may be able to realize the desired features of the devices comprising thin MOMLs in accordance with the present disclosure. In embodiments, the metal containing material for use in the MOML may be a metal compound, particularly metal compounds that may be both electrically conductive and light absorbing such as, for example, $Ag_2O$, $Cu_2O$, CuO, FeO, $Fe_2O_3$, $Fe_3O_4$, NiO, $V_2O_5$, ZnS, ZnO, $In_2O_3$ and $SnO_2$.

A metal-organic mixed layer in accordance with the present disclosure exhibits light-reflection-reduction properties. Consequently, a metal-organic mixed layer, including a metal-organic mixed layer comprising a plurality of metal-organic mixed layers may be referred to as a light-reflection-reduction layer, a light-reflection-reduction region, and/or a light-reflection-reduction zone.

Suitable organic materials for the MOML can be for example electroluminescent materials utilized in fabricating the luminescent region of the display device, such electroluminescent materials being described herein. For example, suitable organic materials for the MOML can include molecular (small-molecule) organic compounds such as metal oxinoids, metal chelates, tertiary aromatic amines, indolocarbazoles, porphyrins, phthalocyanines, triazines, anthracenes, and oxadiazoles; and polymeric compounds such as polythiophenes, polyfluorenes, polyphenylenes, polyanilenes, and polyphenylenevinylenes. Other organic compounds that can also be used in a thin MOML include polypolycarbonates, polyethylenes, polystyrenes, organic dyes and pigments (e.g., perinones, coumarines, and other fused aromatic ring compounds). Other examples of suitable organic materials include, but are not limited to, tris(8-hydroxyquinolate) aluminum ($AlQ_3$) or other suitable complexes of 8-hydroxyquinolines.

An anode can comprise suitable positive charge injecting materials such as indium tin oxide (ITO), silicon, tin oxide, and metals with a work function ranging from about 4 eV to about 6 eV such as gold, platinum, and palladium. Other suitable materials for the anode include, but are not limited to, electrically conductive carbon, π-conjugated polymers such as polyaniline, polythiophene, polypyrrole, and the like having, for example, a work function equal to, or greater than, about 4 eV, and, in embodiments, from about 4 eV to about 6 eV. A substantially transparent anode can comprise, for example, indium tin oxide (ITO), very thin substantially transparent metallic layers, comprising a metal with a work function ranging from about 4 eV to about 6 eV such as gold, palladium and the like, having a thickness, for example, from about 10 angstroms to about 200 angstroms, and, in embodiments, from about 30 angstroms to about 100 angstroms. Additional suitable forms of the anode are disclosed in U.S. Pat. Nos. 4,885,211 and 5,703,436, which are incorporated herein by reference in their entirety. An anode can also comprise a metal-organic mixed layer (MOML) as disclosed in copending U.S. patent application Ser. No. 10/117,812, which is incorporated herein by reference in its entirety. Additionally, an anode may comprise a thin MOML in accordance with the present disclosure. The thickness of the anode can range from about 10 angstroms to about 50,000 angstroms, with the desired range depending on the electrical and optical constants of the anode material. One illustrative range of anode thickness is from about 300 angstroms to about 3,000 angstroms. Of course, a thickness outside of this range can also be used.

A cathode can comprise suitable electron injecting materials, such as metals, including high work function components, such as metals with, for example, a work function from about 4 eV to about 6 eV, or low work function components, such as metals with, for example, a work function of from about 2 eV to about 4 eV. The cathode can comprise a combination of a low work function (less than about 4 eV) metal and at least one other metal. Effective proportions of the low work function metal to the second or other metal are from less than about 0.1 weight percent to about 99.9 weight percent. Illustrative examples of low work function metals include, but are not limited to, alkaline metals such as lithium or sodium; Group 2A or alkaline earth metals such as beryllium, magnesium, calcium or barium; and Group III metals including rare earth metals and the actinide group metals such as scandium, yttrium, lanthanum, cerium, europium, terbium or actinium. Lithium, magnesium and calcium are preferred low work function metals. Materials suitable for forming the cathode include, but are not limited to, the Mg—Ag alloy cathodes described in U.S. Pat. Nos. 4,885,211, 4,720,432, and 5,703,436, the disclosures of which are totally incorporated herein by reference. Other suitable cathodes comprise a metal-organic mixed later (MOML) as disclosed in U.S. patent application Ser. No. 10/117,812, which is incorporated herein by reference in its entirety, and in U.S. Pat. No. 5,429,884, the disclosure of which is totally incorporated herein by reference. The cathode may also include a light-reflection-reduction layer as described in U.S. patent application Ser. No. 11/133,753, which is concurrently filed herewith, the entire disclosure of which is incorporated herein by reference. The cathodes can be formed from lithium alloys with other high work function metals such as aluminum and indium.

A substantially transparent cathode can comprise very thin substantially transparent metallic layers comprising a metal with a work function ranging from about 2 eV to about 4 eV, such as Mg, Ag, Al, Ca, In, Li and their alloys such as Mg:Ag alloys, comprised of, for example, from about 80 to 95 volume percent of Mg and about 20 to about 5 volume percent of Ag, and Li:Al alloys, comprised of, for example, from about 90 to 99 volume percent of Al, and from about 10 to about 1 volume percent of Li, and the like, having a thickness, for example, from about 10 angstroms to about 200 angstroms, and, in embodiments, from about 30 angstroms to about 100 angstroms. Of course, a thickness outside of this range can also be used.

In embodiments, the cathodes may comprise one or more additional layer(s). The one or more additional layers of the cathodes can comprise at least one metal and/or at least one inorganic material. Suitable exemplary metals that can be used in the additional layer(s) include, but are not limited to, Mg, Ag, Al, In, Ca, Sr, Au, Li, Cr and mixtures thereof. Suitable exemplary inorganic materials that can be used in the additional layer(s) include, but are not limited to, SiO, $SiO_2$, LiF, $MgF_2$ and mixtures thereof.

The one or more additional layer(s) can have the same or different functions from each other. For example, one or more additional layers of the cathode can comprise, or can consist essentially of, a metal to form a conductive layer with a low sheet resistance (e.g., <10 Ω/square). In addition, one or more additional layers of the cathode can protect the metal-organic mixed layer from the ambient by forming a passivating layer (such as, for example, a moisture barrier) that prevents, or at least reduces, the permeation of ambient moisture to the MOML, the luminescent region and the anode. Also, one or more additional layers of the cathode can act as a thermal protective layer to provide protection from device shorting at elevated temperatures. For example, such protection can be provided at temperatures ranging from about 60° C. to about 110° C., as discussed in more detail in U.S. Pat. No. 6,614,175, which is incorporated herein by reference in its entirety.

The thickness of the cathode can range from, for example, about 10 nanometers to about 1,000 nanometers. Thicknesses outside of this range can also be used.

The anode and cathode used in the present OLEDs each may be a single layer or may comprise two, three or more layers. For instance, the electrode may be composed of a charge injection layer (i.e., an electron injection layer or a hole injection layer) and a capping layer. In embodiments, however, the charge injection layer may be considered distinct from the electrode.

An electron injecting layer can include very thin substantially transparent metallic layers, composed of a metal with a work function ranging from about 2 eV to about 4 eV, such as Mg, Ag, Al, Ca, In, Li and their alloys such as Mg:Ag alloys composed of, for example, from about 80 to 95 volume percent of Mg and about 20 to about 5 volume percent of Ag, and Li:Al alloys, composed of, for example, from about 90 to 99 volume percent of Al, and from about 10 to about 1 volume percent of Li, and the like, having a thickness, for example, from about 10 angstroms to about 200 angstroms, and, in embodiments, from about 30 angstroms to about 100 angstroms. Of course, a thickness outside of these ranges can also be used. The electron injection layer can also include very thin insulative materials such as an oxide material or an alkaline metal compound as described in U.S. Pat. Nos. 5,457,565; 5,608,287 and 5,739,635, which are each incorporated herein by reference in their entirety.

A hole injecting layer can be composed of suitable positive charge injecting materials such as indium tin oxide (ITO), silicon, tin oxide, and metals with a work function ranging from about 4 eV to about 6 eV, such as, gold, platinum, and palladium. Other suitable materials for the hole injecting layer include, but are not limited to, electrically conductive carbon, π-conjugated polymers such as polyaniline, polythiophene, polypyrrole, and the like having, for example, a work function equal to, or greater than, about 4 eV, and particularly from about 4 eV to about 6 eV. A substantially transparent hole injecting material can be composed of very thin substantially transparent metallic layers, comprising a metal with a work function ranging from about 4 eV to about 6 eV, such as gold, palladium and the like, having a thickness, for example, from about 10 angstroms to about 200 angstroms, and, in some embodiments, from about 30 angstroms to about 100 angstroms. Of course, a thickness outside of these ranges can also be used. Additional suitable forms of hole injecting layers are disclosed in U.S. Pat. Nos. 4,885,211 and 5,703,436, which are incorporated herein by reference in their entirety.

A capping layer on the anode and/or cathode can be included in order to increase the thermal stability, increase the environmental stability, and/or in some other way improve the performance of the organic light emitting device. An example of a capping layer that can be used to increase the thermal stability of the organic light emitting is a layer comprised of SiO, $SiO_2$, or mixtures thereof. Other examples are disclosed in U.S. Pat. Nos. 6,765,348 and 6,614,175, the disclosures of which are totally incorporated herein by reference. An example of a capping layer that can be used to increase the environmental stability of the organic light emitting device is a layer comprised of a stable metal such as Ag, Al, In, or Au. Another example of a capping layer that can be used to increase the environmental stability of the organic light emitting device is a layer comprised of a low work function metal as described, for example, in U.S. Pat. No. 5,059,861. The thickness of the capping layer can, for example, range from about 20 nanometers to about 5,000 nanometers. In embodiments, the thickness is from about 50 nanometers to 500 nanometers.

A display device may optionally comprise a buffer layer between the anode and a hole transporting layer. A buffer layer primarily functions to achieve desirable charge injection of holes from the anode, and to improve adhesion between the anode and the hole transporting layer, thereby improving the device operation stability. Suitable materials that can be utilized in the buffer layer include semiconductive organic materials, such as, for example, porphyrin derivatives like 1,10,15,20-tetraphenyl-21H,23H-porphyrin copper (II) disclosed in U.S. Pat. No. 4,356,429, which is incorporated herein by reference in its entirety; copper phthalocyanine; copper tetramethyl phthalocyanine; zinc phthalocyanine; titanium oxide phthalocyanine; magnesium phthalocyanine; and the like. Mixtures of these and other suitable materials can also be used. Other suitable materials that can be utilized in the buffer layer include semiconductive and insulative metal compounds, such as for example metal oxides like MgO, $Al_2O_3$, BeO, BaO, AgO, SrO, SiO, $SiO_2$, $ZrO_2$, CaO, $Cs_2O$, $Rb_2O$, $Li_2O$, $K_2O$ and $Na_2O$; and metal halides, like LiF, KCl, NaCl, CsCl, CsF and KF. The buffer layer can have a thickness ranging from about 1 nm to about 100 nm. An illustrative thickness range for the buffer layer is from about 5 nm to about 25 nm. Another illustrative thickness range for the buffer layer is from about 1 nm to about 5 nm.

The luminescent region of the present display devices comprises, in embodiments, at least one electroluminescent organic material. The electroluminescent material is not critical and may be any material suitable for use as an electroluminescent material in a display device. Suitable organic electroluminescent materials include, for example, polyphenylenevinylenes, such as poly(p-phenylenevinylene) PPV, poly(2-methoxy-5-(2-ethylhexyloxy) 1,4-phenylenevinylene) (MEHPPV) and poly(2,5-dialkoxyphenylenevinylene) (PDMeOPV), and other materials disclosed in U.S. Pat. No. 5,247,190, which is incorporated herein by reference in its entirety; polyphenylenes, such as poly(p-phenylene) (PPP), ladder-poly-para-phenylene (LPPP), and poly(tetrahydropyrene) (PTHP); and polyfluorenes, such as poly(9, 9-di-n-octylfluorene-2,7-diyl), poly(2,8-(6,7,12,12-tetraalkylindenofluorene) and copolymers containing fluorenes such as fluorene-amine copolymers (see, e.g., Bernius et al., "Developmental Progress of Electroluminescent Polymeric Materials and Devices," Proceedings of SPIE Conference on Organic Light Emitting Materials and Devices III, Denver, Colo., July 1999, Volume 3797, p. 129).

Another class of organic electroluminescent materials that can be utilized in the luminescent region includes, but is not limited to, the metal oxinoid compounds as disclosed in U.S. Pat. Nos. 4,539,507; 5,151,629; 5,150,006; 5,141,671 and 5,846,666, each incorporated herein by reference in its entirety. Illustrative examples include tris(8-hydroxyquinolinate)aluminum (AlQ3), and bis(8-hydroxyquinolato)-(4-phenylphenolato)aluminum (BAlq). Other examples of this class of materials include tris(8-hydroxyquinolinate)gallium, bis(8-hydroxyquinolinate)magnesium, bis(8-hydroxyquinolinate)zinc, tris(5-methyl-8-hydroxyquinolinate)aluminum, tris(7-propyl-8-quinolinolato)aluminum, bis[benzo{f}-8-quinolinate]zinc, bis(10-hydroxybenzo[h]quinolinate)beryllium, and the like, and metal thioxinoid compounds disclosed in U.S. Pat. No. 5,846,666 (which is incorporated herein by reference in its entirety), such as metal thioxinoid compounds of bis(8-quinolinethiolato)zinc, bis(8-quinolinethiolato)cadmium, tris(8-quinolinethiolato)gallium, tris(8-quinolinethiolato)indium, bis(5-methylquinolinethiolato)zinc, tris(5-methylquinolinethiolato)gallium, tris(5-methylquinolinethiolato)indium, bis(5-methylquinolinethiolato)cadmium, bis(3-methylquinolinethiolato)cadmium, bis(5-methylquinolinethiolato)zinc, bis[benzo{f}-8-quinolinethiolato]zinc, bis[3-methylbenzo{f}-8-quinolinethiolato]zinc, bis[3,7-dimethylbenzo{f}-8-quinolinethiolato]zinc, and the like.

More specifically, a class of organic electroluminescent materials that can be used in the luminescent region comprises stilbene derivatives, such as those disclosed in U.S. Pat. No. 5,516,577, incorporated herein by reference in it entirety. A non-limiting example of a suitable stilbene derivative is 4,4'-bis(2,2-diphenylvinyl)biphenyl.

A class of bipolar transport materials that can be used in a mixed region comprises anthracenes, such as, for example 2-t-butyl-9,10-di-(2-naphthyl)anthracene, 9,10-di-(2-naphthyl) anthracene, 9,10-di-phenyl anthracene, 9,9-bis[4-(9-anthryl)phenyl]fluorine, and 9,9-bis[4-(10-phenyl-9-anthryl) phenyl]fluorine. Other suitable anthracenes are disclosed in U.S. application Ser. No. 09/208,172 (corresponding to EP 1009044 A2), those disclosed in U.S. Pat. No. 5,972,247, U.S. Pat. No. 5,935,721, and those disclosed in U.S. application Ser. No. 09/771,311 the disclosures of which are totally incorporated herein by reference.

Another class of suitable organic electroluminescent materials suitable for use in the luminescent region is the oxadiazole metal chelates disclosed in U.S. patent application Ser. No. 08/829,398, which is incorporated herein by reference in its entirety. These materials include bis[2-(2-hydroxyphenyl)-5-phenyl-1,3,4-oxadiazolato]zinc; bis[2-(2-hydroxyphenyl)-5-phenyl-1,3,4-oxadiazolato]beryllium; bis[2-(2-hydroxyphenyl)-5-(1-naphthyl)-1,3,4-oxadiazolato]zinc; bis [2-(2-hydroxyphenyl)-5-(1-naphthyl)-1,3,4-oxadiazolato] beryllium; bis[5-biphenyl-2-(2-hydroxyphenyl)-1,3,4-oxadiazolatolzinc; bis[5-biphenyl-2-(2-hydroxyphenyl)-1,3, 4-oxadiazolato]beryllium; bis(2-hydroxyphenyl)-5-phenyl-1,3,4-oxadiazolato]lithium; bis[2-(2-hydroxyphenyl)-5-p-tolyl-1,3,4-oxadiazolato]zinc; bis[2-(2-hydroxyphenyl)-5-p-tolyl-1,3,4-oxadiazolato]beryllium; bis[5-(p-tert-butylphenyl)-2-(2-hydroxyphenyl)-1,3,4-oxadiazolato]zinc; bis[5-(p-tert-butylphenyl)-2-(2-hydroxyphenyl)-1,3,4-oxadiazolato]beryllium; bis[2-(2-hydroxyphenyl)-5-(3-fluorophenyl)-1,3,4-oxadiazolato]zinc; bis[2-(2-hydroxyphenyl)-5-(4-fluorophenyl)-1,3,4-oxadiazolato]zinc; bis[2-(2-hydroxyphenyl)-5-(4-fluorophenyl)-1,3,4-oxadiazolato] beryllium; bis[5-(4-chlorophenyl)-2-(2-hydroxyphenyl)-1,3, 4-oxadiazolato]zinc; bis[2-(2-hydroxyphenyl)-5-(4-methoxyphenyl)-1,3,4-oxadiazolato]zinc; bis[2-(2-hydroxy-4-methylphenyl)-5-phenyl-1,3,4-oxadiazolato]zinc; bis[2-u,-(2-hydroxynaphthyl)-5-phenyl-1,3,4-oxadiazolato]zinc; bis[2-(2-hydroxyphenyl)-5-p-pyridyl-1,3,4-oxadiazolato] zinc; bis[2-(2-hydroxyphenyl)-5-p-pyridyl-1,3,4-oxadiazolato]beryllium; bis[2-(2-hydroxyphenyl)-5-(2-thiophenyl)-1,3,4-oxadiazolato]zinc; bis[2-(2-hydroxyphenyl)-5-phenyl-1,3,4-thiadiazolato]zinc; bis[2-(2-hydroxyphenyl)-5-phenyl-1,3,4-thiadiazolato]beryllium; bis[2-(2-hydroxyphenyl)-5-

(1-naphthyl)-1,3,4-thiadiazolato]zinc; and bis[2-(2-hydroxyphenyl)-5-(1-naphthyl)-1,3,4-thiadiazolato] beryllium, and the like; and the triazines including those disclosed in U.S. patent application Ser. No. 09/489,144, filed on Jan. 21, 2000 and U.S. Pat. No. 6,057,048, each incorporated herein in its entirety. The luminescent region can further include from about 0.01 weight percent to about 25 weight percent of a luminescent material as a dopant. Examples of dopant materials that can be utilized in the luminescent region are fluorescent materials, such as, for example, coumarin, dicyanomethylene pyranes, polymethine, oxabenzanthrane, xanthene, pyrylium, carbostyl, perylene, and the like. Another suitable class of fluorescent materials are quinacridone dyes. Illustrative examples of quinacridone dyes include quinacridone, 2-methylquinacridone, 2,9-dimethylquinacridone, 2-chloroquinacridone, 2-fluoroquinacridone, 1,2-benzoquinacridone, N,N'-dimethylquinacridone, N,N'-dimethyl-2-methylquinacridone, N,N'-dimethyl-2,9-dimethylquinacridone, N,N'-dimethyl-2-chloroquinacridone, N,N'-dimethyl-2-fluoroquinacridone, N,N'-dimethyl-1,2-benzoquinacridone, and the like as disclosed in U.S. Pat. Nos. 5,227,252; 5,276,381; and 5,593,788, each incorporated herein in its entirety. Another class of fluorescent materials that may be used is fused ring fluorescent dyes. Exemplary suitable fused ring fluorescent dyes include perylene, rubrene, anthracene, coronene, phenanthrecene, pyrene and the like, as disclosed in U.S. Pat. No. 3,172,862, which is incorporated herein by reference in its entirety. Also, fluorescent materials include butadienes, such as 1,4-diphenylbutadiene and tetraphenylbutadiene, and stilbenes, and the like, as disclosed in U.S. Pat. Nos. 4,356,429 and 5,516,577, each incorporated herein by reference in its entirety. Other examples of fluorescent materials that can be used are those disclosed in U.S. Pat. No. 5,601,903, which is incorporated herein by reference in its entirety.

Additionally, luminescent dopants that can be utilized in the light luminescent region are the fluorescent dyes disclosed in U.S. Pat. No. 5,935,720 (which is incorporated herein by reference in its entirety), such as, for example, 4-(dicyanomethylene)-2-1-propyl-6-(1,1,7,7-tetramethyljulolidyl-9-enyl)4H-pyran (DCJTB); the lanthanide metal chelate complexes, such as for example, tris(acety lacetonato) (phenanthroline) terbium, tris(acetyl acetonato)(phenanthroline)europium, and tris(thenoyl trisfluoroacetonato)(phenanthroline) europium, and those disclosed in Kido et al., "White light emitting organic electroluminescent device using lanthanide complexes," Jpn. J. Appl. Phys., Volume 35, pp. L394-L396 (1996), which is incorporated herein by reference in its entirety; and phosphorescent materials, such as, for example, organometallic compounds containing heavy metal atoms that lead to strong spin-orbit coupling, such as those disclosed in Baldo et. al., "Highly efficient organic phosphorescent emission from organic electroluminescent devices," Letters to Nature, Volume 395, pp. 151-154 (1998), which is incorporated herein by reference in its entirety. Preferred examples include 2,3,7,8,12,13,17,18-octaethyl-21H23H-phorpine platinum(II) (PtOEP) and fac tris(2-phenylpyridine)iridium (Ir(ppy)3).

The luminescent region can also include one or more materials with hole-transporting properties. Examples of hole-transporting materials that can be utilized in the luminescent region include polypyrrole, polyaniline, poly(phenylene vinylene), polythiophene, polyarylamine as disclosed in U.S. Pat. No. 5,728,801, which is incorporated herein by reference in its entirety, and their derivatives, and known semiconductive organic materials; porphyrin derivatives such as 1,10,15,20-tetraphenyl-21H,23H-porphyrin copper (II) disclosed in U.S. Pat. No. 4,356,429, incorporated herein by reference in its entirety; copper phthalocyanine; copper tetramethyl phthalocyanine; zinc phthalocyanine; titanium oxide phthalocyanine; magnesium phthalocyanine; and the like.

A specific class of hole transporting materials that can be utilized in the luminescent region are the aromatic tertiary amines such as those disclosed in U.S. Pat. No. 4,539,507, which is incorporated herein by reference in its entirety. Suitable exemplary aromatic tertiary amines include, but are not limited to, bis(4-dimethylamino-2-methylphenyl)phenylmethane; N,N,N-tri(p-tolyl)amine; 1,1-bis(4-di-p-tolylaminophenyl)cyclohexane; 1,1-bis(4-di-p-tolylaminophenyl)-4-phenyl cyclohexane; N,N'-diphenyl-N,N'-bis(3-methylphenyl)-1,1'-biphenyl-4,4'-diamine; N,N'-diphenyl-N,N'-bis(3-methylphenyl)-1,1'-biphenyl-4,4'-diamine; N,N'-diphenyl-N,N'-bis(4-methoxyphenyl)-1,1'-biphenyl-4,4'-diamine; N,N,N',N'-tetra-p-tolyl-1,1'-biphenyl-4,4'-diamine; N,N'-di-1-naphthyl-N,N'-diphenyl-1,1'-biphenyl-4,4'-diamine; N,N'-di(naphthalene-1-yl)-N,N'-diphenyl-benzidine ("NPB"); mixtures thereof and the like. Another class of aromatic tertiary amines are polynuclear aromatic amines. Examples of these polynuclear aromatic amines include, but are not limited to, N,N-bis-[4'-(N-phenyl-N-m-tolylamino)-4-biphenylyl]aniline; N,N-bis-[4'-(N-phenyl-N-m-tolylamino)-4-biphenylyl]-m-toluidine; N,N-bis-[4'-(N-phenyl-N-m-tolylamino)-4-biphenylyl]-p-toluidine; N,N-bis-[4'-(N-phenyl-N-p-tolylamino)-4-biphenylyl]aniline; N,N-bis-[4'-(N-phenyl-N-p-tolylamino)-4-biphenylyl]-m-toluidine; N,N-bis-[4'-(N-phenyl-N-p-tolylamino)-4-biphenylyl]-p-toluidine; N,N-bis-[4'-(N-phenyl-N-p-chlorophenylamino)-4-biphenylyl]-m-toluidine; N,N-bis-[4'-(N-phenyl-N-m-chlorophenylamino)-4-biphenylyl]-m-toluidine; N,N-bis-[4'-(N-phenyl-N-m-chlorophenylamino)-4-biphenylyl]-p-toluidine; N,N-bis-[4'-(N-phenyl-N-m-tolylamino)-biphenylyl]-p-chloroaniline; N,N-bis-[4'-(N-phenyl-N-p-tolylamino)-4-biphenylyl]-m-chloroaniline; N,N-bis-[4'-(N-phenyl-N-m-tolylamino)-4-biphenylyl]-1-aminonaphthalene, mixtures thereof and the like; 4,4'-bis(9-carbazolyl)-1,1'-biphenyl compounds, such as, for example 4,4'-bis(9-carbazolyl)-1,1'-biphenyl and 4,4'-bis(3-methyl-9-carbazolyl)-1,1'-biphenyl, and the like.

A specific class of the hole transporting materials that can be used in the luminescent region are the indolo-carabazoles, such as those disclosed in U.S. Pat. Nos. 5,942,340 and 5,952,115, each incorporated herein by reference in its entirety, such as, for example, 5,11-di-naphthyl-5,11-dihydroindolo[3,2-b]carbazole, and 2,8-dimethyl-5,11-di-naphthyl-5,11-dihydroindolo[3,2-b]carbazole; N,N,N'N'-tetraarylbenzidines, wherein aryl may be selected from phenyl, m-tolyl, p-tolyl, m-methoxyphenyl, p-methoxyphenyl, 1-naphthyl, 2-naphthyl and the like. Illustrative examples of N,N,N'N'-tetraarylbenzidine are N,N-di-1-naphthyl-N,N'-diphenyl-1,1'-biphenyl-4,4'-diamine; N,N'-bis(3-methylphenyl)-N,N'-diphenyl-1,1'-biphenyl-4,4'-diamine; N,N'-bis(3-methoxyphenyl)-N,N'-diphenyl-1,1'-biphenyl-4,4'-diamine, and the like. Suitable hole transporting materials that can be used in the luminescent region are the naphtyl-substituted benzidine derivatives.

The luminescent region can also include one or more materials with electron transporting properties. An example of electron transporting materials that can be utilized in the luminescent region is polyfluorenes, such as poly(9,9-di-n-octylfluorene-2,7-diyl), poly(2,8-(6,7,12,12-tetraalkylindenofluorene) and copolymers containing fluorenes such as fluorene-amine copolymers, as disclosed in incorporated Bernius et al., Proceedings of SPIE Conference on Organic Light Emitting Materials and Devices III, Denver, Colo., July 1999, Volume 3797, p. 129.

Other examples of electron transporting materials that can be utilized in the luminescent region can be selected from the metal oxinoid compounds, the oxadiazole metal chelate compounds, the triazine compounds and the stilbene compounds, examples of which have been described above in detail.

In embodiments where the luminescent region includes one or more hole transport material and/or one or more electron transport material in addition to the organic electroluminescent material(s), the organic electroluminescent material, the hole transport material(s), and/or the electron transport material(s) can be formed in separate layers, such as, for example, the OLEDs disclosed in U.S. Pat. Nos. 4,539,507; 4,720,432 and 4,769,292; or in the same layer thus forming mixed zones of two or more materials, such as, for example, the OLEDs disclosed in U.S. Pat. Nos. 6,130,001; 6,392,339; 6,392,250, and 6,614,175. The disclosures of these patents and patent applications are incorporated herein by reference in their entirety.

The thickness of the luminescent region can vary from, for example, about 1 nm to about 1000 nm. In embodiments, the thickness of the luminescent region is from about 20 nm to about 200 nm, and, in other embodiments, from about 50 nm to about 150 nm.

As described herein, a thing metal-organic mixed layer in accordance with the present disclosure may be a single layer MOML configuration or a multi-layer configuration. Where the MOML is a single layer configuration, the thin MOML has a thickness generally in the range of from about 5 nm to about 165 nm. In a single layer MOML comprising Ag as the metal, the thickness of the MOML is typically i) from about 10 nm to about 60 nm when the Ag cone is from about 20 to about 30%, and ii) from about 100 nm to about 160 nm when the Ag cone is from about 10 to about 18%. In embodiments, a thin-layer MOML or region may have a multi-layer configuration comprising 2, 3, 4, 5, or more MOMLs. The thickness of a multi-layer MOML, with is the sum of the individual MOMLs, is generally in the range of from about 5 nm to about 170 nm. In embodiments, the thickness of a multi-layer MOML is in the range of from about 15 nm to about 75 nm. In other embodiments, the thickness of a multi-layer MOML is in the range of from about 110 nm to about 170 nm. Still in some other embodiments the MOML layers may have a thickness of from 5 nm to 46 nm. In multi-layer thin-layer MOML configurations, each individual layer of the MOML may have a thickness of from about 5 nm to about 95 nm, for example, 10 nm to 46 nm, or 5 nm to 30 nm, or 5 nm to 45 nm.

In embodiments, the metal containing material are present in a thin MOML in an amount of from about 5 to about 50 percent by volume and the organic material is present in an amount of from about 50 to about 5 percent by volume of the MOML. In other embodiments, the metal containing material is present in an amount of from about 5 to about 30 percent by volume and the organic material is present in an amount of from about 90 to about 70 percent by volume of the MOML. In still further embodiments, the metal containing material is present in an amount of from about 5 to about 40 percent by volume of the MOML.

In one embodiment, a thin MOML is a single layer configuration comprising Ag and one or more organic materials, wherein the thin MOML comprises Ag in an amount of from about 5 to about 30 percent by volume of the MOML and has a thickness of from about 10 nm to about 60 nm or from about 100 nm to about 160 nm. In another embodiment, a thin MOML comprises Ag in an amount of about 20 to about 30 percent by volume of the MOML and has a thickness of from about 10 nm to about 60 nm. In yet another embodiment, a thin MOML comprises Ag in an amount of from about 10 to about 18 percent by volume and has a thickness of from about 100 nm to about 160 nm.

Any suitable technique may be employed to form a thin MOML and display device in accordance with the present disclosure. Suitable techniques include, but are not limited to, physical thermal vapor deposition (PVD), spin-coating, sputtering, electron beam, electron arc, chemical vapor deposition, and the like. In PVD, for example, a light-reflection-reduction layer is formed by co-evaporating the metal and matrix material from heated sources in a vacuum and condensing/depositing the vapor on the desired substrate/surface through a mask. The evaporation rate of the individual materials is controlled in order to obtain the desired metal particle size and the desired ratio of the metal and matrix components.

Thin metal-organic mixed layers as described herein are suitable for use in a display device to reduce the reflection of ambient light in the device. Reflection reduction may be quantified in terms of, for example, a Sun/Eye-Integrated Reflectance Percentage (SEIR %). SEIR is the total percent fraction of incident light that gets reflected off the display device, e.g., OLED, front integrated over the entire visible range of the visible spectrum (in the range of 400-700 nm for incident light) and weighted to the human eye sensitivity over that range. A display device comprising a thin MOML as described herein reduces light reflection by at least about 30%, and in embodiments, by at least about 50% as compared to a display device that does not include any MOML. In embodiments, a display device employing a thin metal-organic mixed layer in accordance with the present disclosure may have a percent reflection of less than about 50%. In other embodiments, the percent reflection may by less than about 20%. In still other embodiments, the percent reflection may be less than about 10%.

While the use of thin metal-organic mixed layers in accordance with the present disclosure have been described with reference to OLEDs, it will be appreciated that such metal-organic mixed layers may be applied to any kind of OLED or other display devices. For example, a thin metal-organic mixed layer in accordance with the present disclosure may be suitable for use in molecular (small-molecule)-based OLEDs, dendrimer-based OLEDs, polymer-based OLEDs, hybrid OLEDs comprising both molecular and polymeric materials in the light-emitting region, hybrid OLEDs comprising both organic and inorganic materials in the light-emitting region, inorganic electroluminescent or phosphor devices, liquid crystal displays (LCDs), plasma displays, and the like.

Display devices comprising a metal-organic mixed layer according to the present disclosure are further described and understood with reference to the following examples. The examples are for purpose of illustration only and are not intended to be limiting in any manner.

Example I

Examples 1-24 in Table 1 below summarize OLED devices comprising thin-layer light-reflection-reduction layers that have been reduced to practice. Example 1 is a control device that does not include any MOML. Examples 2-10 comprise a single thin-layer MOML. Examples 11-24 comprise a multi-layer thin-layer MOMLs of either 2 or 3 layers.

Figure 7:
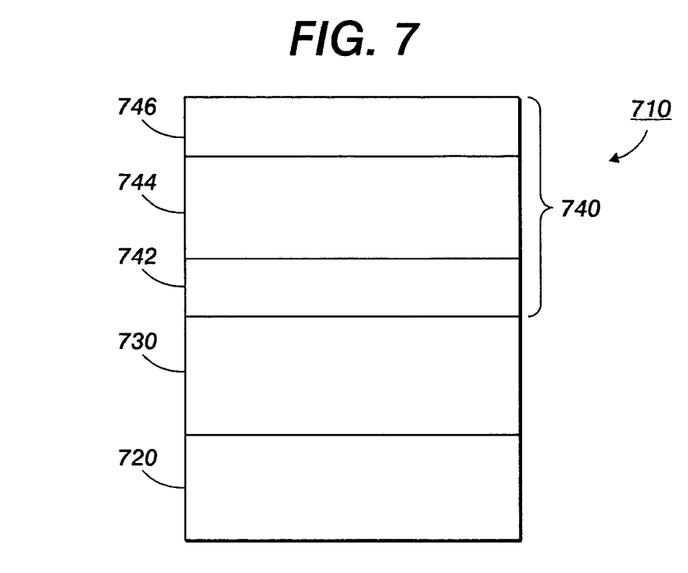
FIG. 7 is a schematic cross-sectional view of a display device prepared in accordance with Example I and comprising a single thin MOML in the cathode.
Figure 8:
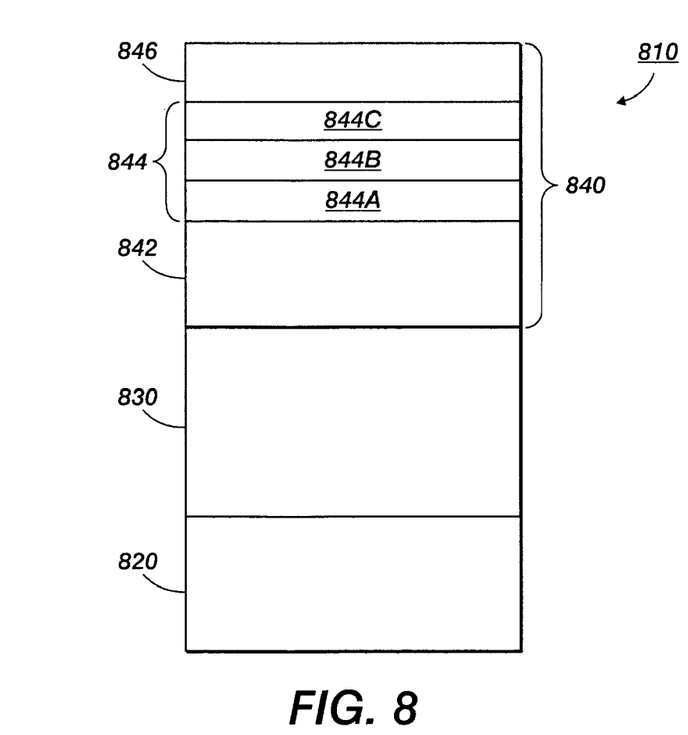
FIG. 8 is a schematic cross-sectional view of a display device prepared in accordance with Example I and comprising a multi-layer thin MOML in the cathode.

Schematic diagrams illustrating the general structure of the reduced to practice examples of Examples 2-24 are shown in FIGS. 7 and 8. With reference to FIG. 7, an organic light emitting device is shown comprising a single layer thin-layer MOML. In FIG. 7, organic light emitting device 710 comprises an anode 720, a light emitting region 730, and a cathode 740. Cathode 740 comprises an optional electron injecting layer 742, a thin-layer MOML 744, and a capping layer 746. With reference to FIG. 8, an organic light emitting device comprising a multi-layer thin-layer MOML is shown. Organic light emitting device 810 comprises an anode 820, a light emitting region 830, and a cathode 840. Cathode 840 comprises an optional electron injecting layer 842, a capping layer 846, a multi-layer thin-layer MOML 844 comprising separate metal-organic mixed layers 844A, 844B, and optionally 844C.

All devices were fabricated using physical vapor deposition in vacuum ($5 \times 10^{-6}$ Torr) on ITO-coated glass substrates that were pre-cleaned using UV-ozone cleaning. In Examples 1-24 the light emission region comprised two layers: i) a 60 nm NPB layer functioning as a hole transport zone, and ii) a 75 nm $AlQ_3$ layer functioning to provide both light emission and electron transport. The NPB and $AlQ_3$ layers were sequentially deposited on the ITO-coated substrates, where the ITO functioned as a hole injecting anode. In the devices of Examples 2-24, the cathodes included a thin MOML, a capping layer, and optionally, an electron injecting layer (as set forth in Table 1). The numbers in parentheses refer to layer thickness in nanometers (nm). Table 1 summarizes results from reflectance measurements, represented in Sun/Eye-Integrated Reflectance Percentage (SEIR %).

TABLE 1

| Example # | Cathode | | | | |
|---|---|---|---|---|---|
| | Electron Injection Layer (EIL) (optional) | MOML1 (or MOML in cases of single layer MOML configuration) | MOML2 | MOML3 | Capping Layers |
| 1 | — | — | | | Mg:Ag(120)/Ag(90) |
| 2 | Ca(2 nm) | AlQ3 + Ag(75%:25%)(35 nm) | | | Mg:Ag(120)/Ag(90) |
| 3 | Ca(2 nm) | AlQ3 + Ag(75%:25%)(39 nm) | | | Mg:Ag(120)/Ag(90) |
| 4 | Ca(2 nm) | AlQ3 + Ag(80%:20%)(40 nm) | | | Mg:Ag(120)/Ag(90) |
| 5 | Ca(2 nm) | AlQ3 + Ag(80%:20%)(43 nm) | | | Mg:Ag(120)/Ag(90) |
| 6 | Ca(2 nm) | AlQ3 + Ag(80%:20%)(45 nm) | | | Mg:Ag(120)/Ag(90) |
| 7 | Ca(2 nm) | AlQ3 + Ag(80%:20%)(30 nm) | | | Mg:Ag(120)/Ag(90) |
| 8 | Ca(2 nm) | AlQ3 + Ag(75%:25%)(45 nm) | | | Mg:Ag(120)/Ag(90) |
| 9 | Ca(2 nm) | AlQ3 + Ag(80%:20%)(45 nm) | | | Mg:Ag(120)/Ag(90) |
| 10 | Ca(2 nm) | AlQ3 + Ag(85%:15%)(45 nm) | | | Mg:Ag(120)/Ag(90) |
| 11 | — | AlQ3 + Ag(83%:17%)(23 nm) | AlQ3 + Ag(75%:25%)(23 nm) | | Mg:Ag(120)/Ag(90) |
| 12 | — | AlQ3 + Ag(85%:15%)(23 nm) | AlQ3 + Ag(78%:22%)(23 nm) | | Mg:Ag(120)/Ag(90) |
| 13 | — | AlQ3 + Ag(85%:15%)(23 nm) | AlQ3 + Ag(75%:25%)(23 nm) | | Mg:Ag(120)/Ag(90) |
| 14 | — | AlQ3 + Ag(80%:20%)(23 nm) | AlQ3 + Ag(75%:25%)(23 nm) | | Mg:Ag(120)/Ag(90) |
| 15 | Ca(2 nm) | AlQ3 + Ag(80%:20%)(15 nm) | AlQ3 + Ag(70%:30%)(15 nm) | | Mg:Ag(120)/Ag(90) |
| 16 | Ca(2 nm) | AlQ3 + Ag(90%:10%)(30 nm) | AlQ3 + Ag(70%:30%)(15 nm) | | Mg:Ag(120)/Ag(90) |
| 17 | Ca(2 nm) | AlQ3 + Ag(80%:20%)(15 nm) | AlQ3 + Ag(70%:30%)(15 nm) | AlQ3 + Ag(90%:10%)(15 nm) | Mg:Ag(120)/Ag(90) |
| 18 | Ca(2 nm) | AlQ3 + Ag(80%:20%)(15 nm) | AlQ3 + Ag(90%:10%)(15 nm) | AlQ3 + Ag(70%:30%)(15 nm) | Mg:Ag(120)/Ag(90) |
| 19 | Ca(2 nm) | AlQ3 + Ag(90%:10%)(15 nm) | AlQ3 + Ag(80%:20%)(15 nm) | AlQ3 + Ag(70%:30%)(15 nm) | Mg:Ag(120)/Ag(90) |
| 20 | Ca(2 nm) | AlQ3 + Ag(90%:10%)(15 nm) | AlQ3 + Ag(70%:30%)(15 nm) | AlQ3 + Ag(80%:20%)(15 nm) | Mg:Ag(120)/Ag(90) |
| 21 | Ca(2 nm) | AlQ3 + Ag(70%:30%)(15 nm) | AlQ3 + Ag(80%:20%)(15 nm) | AlQ3 + Ag(90%:10%)(15 nm) | Mg:Ag(120)/Ag(90) |
| 22 | Ca(2 nm) | AlQ3 + Ag(80%:20%)(15 nm) | AlQ3 + Ag(90%:10%)(15 nm) | AlQ3 + Ag(70%:30%)(15 nm) | Mg:Ag(120)/Ag(90) |
| 23 | Ca(2 nm) | AlQ3 + Ag(90%:10%)(65 nm) | AlQ3 + Ag(80%:20%)(15 nm) | AlQ3 + Ag(70%:30%)(15 nm) | Mg:Ag(120)/Ag(90) |
| 24 | Ca(2 nm) | AlQ3 + Ag(90%:10%)(25 nm) | AlQ3 + Ag(80%:20%)(25 nm) | AlQ3 + Ag(70%:30%)(50 nm) | Mg:Ag(120)/Ag(90) |

| Example # | Total Thickness of MOML configuration | Sun/Eye-weighted Integrated Reflectivity (SEIR %) | Remarks |
|---|---|---|---|
| 1 | — | 76.10% | No MOMLs (prior art) |
| 2 | 35 nm | 12.50% | Various single layer MOML configurations according to embodiments of this |
| 3 | 39 nm | 11.40% | disclosure. From the results, it is clear that the reduced reflectance effect (from |
| 4 | 40 nm | 9.70% | SEIR % values) can be changed or minimized by changing the composition and/or |
| 5 | 43 nm | 8.70% | thickness of the MOML |
| 6 | 45 nm | 8.40% | |
| 7 | 30 nm | 9.60% | |
| 8 | 45 nm | 15.60% | |
| 9 | 45 nm | 10.70% | |
| 10 | 45 nm | 14.20% | |
| 11 | 46 nm | 8.6% | Various multiple layer MOML configurations according to embodiments of this |
| 12 | 46 nm | 8.00% | disclosure. From the results, it is clear that the reduced reflectance effect (from |
| 13 | 46 nm | 7.70% | SEIR % values) can be changed or minimized by changing the composition and/or |
| 14 | 46 nm | 9.00% | thickness of the individual layers or by changing the order of the layers in the stack |
| 15 | 30 nm | 12.10% | |
| 16 | 45 nm | 9.40% | |
| 17 | 45 nm | 12.50% | |
| 18 | 45 nm | 7.30% | |
| 19 | 45 nm | 7.40% | |
| 20 | 45 nm | 7.90% | |
| 21 | 45 nm | 9.80% | |

TABLE 1-continued

| 22 | 45 nm | 6.90% |
|----|-------|-------|
| 23 | 95 nm | 9.30% |
| 24 | 100 nm | 10.30% |

Example II

Figure 9:
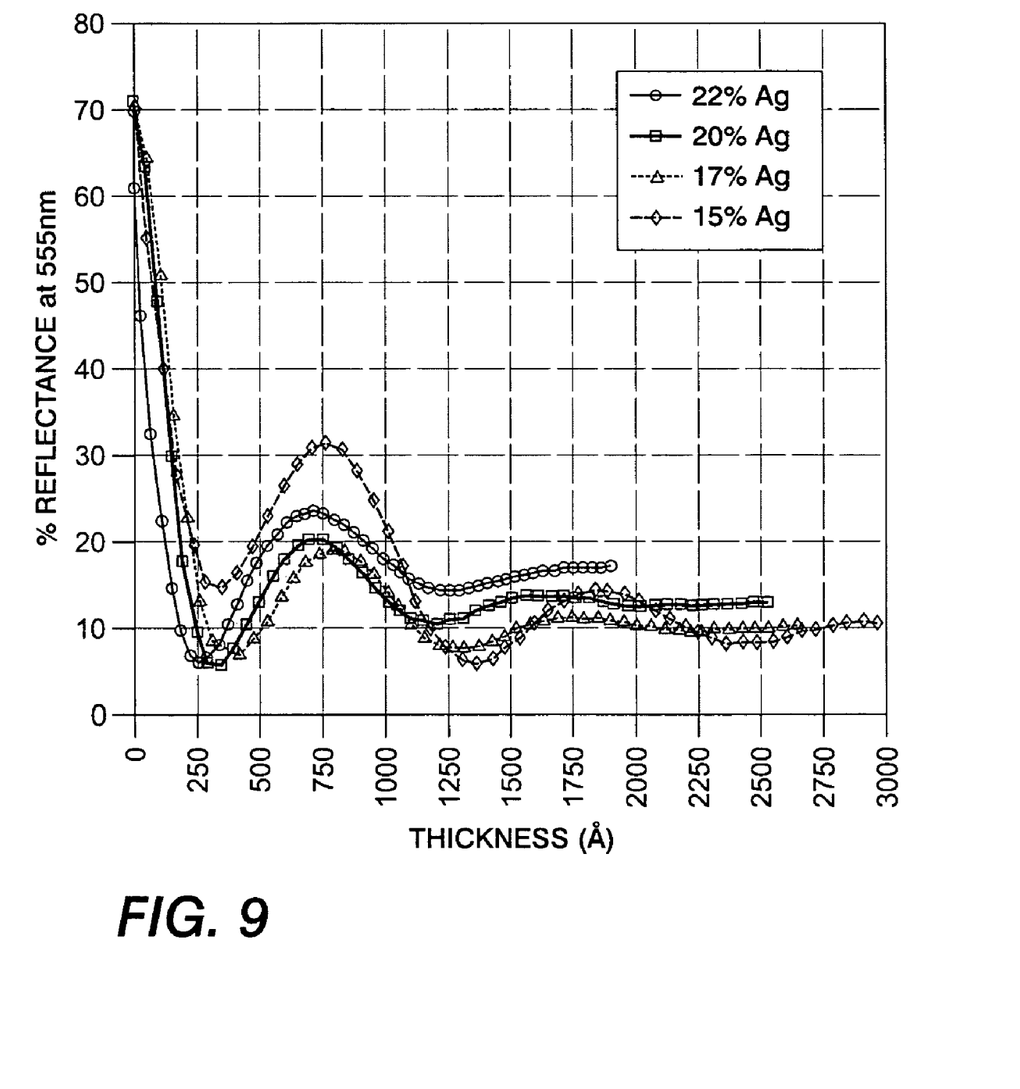
FIG. 9 is a graph of percent reflectance v. MOML thickness for single thin MOMLs comprising different concentrations of Ag.

Devices comprising a single layer thin MOML as part of the cathode were prepared as described with respect to the devices in EXAMPLE I. The single layer MOMLs in this example comprised Ag and AlQ$_3$. MOMLs comprising Ag in an amount of 15%, 17%, 20% and 22% by volume, respectively, were evaluated in several devices at different thicknesses ranging from 0 (i.e., no MOML) to 300 nm. The percentage reflection of the devices was evaluated at a wavelength of 555 nm. FIG. 9 is a graph plotting the percentage reflectance against MOML thickness for the single layer MOMLs with different Ag concentrations. As shown in FIG. 9, the reflectance level may be controlled and/or optimized by varying the concentration of the metal and/or the thickness of the MOML.

While particular embodiments have been described, alternatives, modifications, variations, improvements, and substantial equivalents that are or may be presently unforeseen may arise to applicants or others skilled in the art. Accordingly, the appended claims as filed and as they may be amended are intended to embrace all such alternatives, modifications, variations, improvements, and substantial equivalents.

The invention claimed is:

1. A display device comprising:
   an anode;
   a cathode;
   a luminescent region disposed between said anode and said cathode; the luminescent region optionally comprising an organic electroluminescent material; and
   a light-reflection-reduction region comprising three metal-organic mixed layers (MOMLs) each comprising a different concentration level of i) a metal containing material, and ii) an organic material, the three metal-organic mixed layers having the same metal containing material and the same organic material, wherein said light-reflection-reduction region has a thickness of from 30 nm to 50 nm, and each metal-organic mixed layer has a thickness of from 1 nm to 45 nm.

2. The display device according to claim 1, wherein each of said metal-organic mixed layers comprises said metal containing material in an amount of from about 5 to about 50 percent by volume of the MOML and said organic material in an amount of from about 50 to about 5 percent by volume of the MOML.

3. The display device according to claim 1, wherein said metal is present is in an amount of from about 5 to about 30 percent by volume in each of said MOML.

4. The display device according to claim 3, wherein said metal is Ag.

5. The display device according to claim 1, wherein said metal is Ag, and wherein the organic mixed layer comprises said metal in an amount from about 5 to about 30 percent by volume in each of said MOML.

6. The display device according to claim 1, wherein said metal is Ag, and wherein each metal-organic mixed layer comprises said metal in an amount of from about 20 to about 30 percent by volume of said MOML.

7. The display device according to claim 1, wherein each MOML is interposed between the said cathode and said luminescent region.

8. The display device according to claim 1, wherein each MOML is interposed between said anode and said luminescent region.

9. The display device according to claim 1, wherein each metal-organic mixed layer comprises a plurality of metal-organic mixed layers.

10. The display device according to claim 1, wherein the luminescent region comprises an organic electroluminescent material.

11. A display device comprising:
    a first electrode;
    a second electrode;
    a luminescent region disposed between said first and second electrodes; the luminescent region optionally comprising an organic electroluminescent material; and
    a light-reflection-reduction region comprising a plurality of metal-organic mixed layers, each metal-organic mixed layer comprising a different concentration levels of a metal and of an organic material, the metal-organic mixed layers having the same metal and the same organic material, wherein said light-reflection-reduction region has a thickness of from 30 nm to 50 nm, and wherein each metal-organic mixed layer has a thickness of from 1 nm to 45 nm.

12. The display device according to claim 11, wherein each of said plurality of metal-organic mixed layers independently comprises said metal in an amount of from about 5 to about 50 percent by volume of the metal-organic mixed layer.

13. The display device according to claim 12, wherein each of said plurality of metal-organic mixed layers comprises Ag.

14. The display device according to claim 11, wherein each of said plurality of metal-organic mixed layers independently comprises said metal in an amount of from about 10 to about 40 percent by volume of the metal-organic mixed layer.

15. The display device according to claim 14, wherein said metal is Ag.

16. The display device according to claim 11, wherein said light-reflection-reduction region is interposed between the said cathode and said luminescent region.

17. The display device according to claim 11, wherein said light-reflection-reduction region is interposed between said anode and said luminescent region.

18. The display device according to claim 11, wherein the luminescent region comprises an organic electroluminescent material.

19. A display device comprising:
    (i) an anode;
    (ii) a luminescent region disposed on said anode; the luminescent region optionally comprising an organic electroluminescent material;
    (iii) an optional layer comprising an electron injecting material disposed on said luminescent region;
    (iv) three metal-organic mixed layers (MOMLs) disposed on one of (i) said optional electron injection material; and (ii) said luminescent region; each metal-organic mixed layer comprising a different concentration of a Ag containing material and of an organic material, wherein the organic material is the same in all three metal-organic mixed layers, and wherein said Ag containing material is present in an amount of from about 5 to about 30 percent by volume in each metal-organic mixed layer and each metal-organic mixed layer has a thickness from 1 nm to 45 nm and, (v) a cathode.

20. The display device according to claim 19, wherein each MOML comprises Ag in an amount of from about 20 to about 30 percent by volume of the MOML.

21. The display device of claim 20, wherein each MOML comprises Ag in an amount of about 22 percent by volume of the MOML.

22. The display device according to claim 19, wherein the said optional layer comprising an electron injecting material is present.

23. The display device according to claim 22, wherein the said electron injecting material is selected from Ca, Li, K, Na, Mg, Al, In, Y, Sr, Cs, Cr, Ba, Sc and compounds thereof.

24. The display device according to claim 23, wherein said layer comprising an electron injecting material has a thickness from about 0.1 nm to about 10 nm.

25. The display device according to claim 19, wherein the luminescent region comprises an organic electroluminescent material.

* * * * *